United States Patent
Mitomo et al.

(10) Patent No.: US 6,826,216 B2
(45) Date of Patent: Nov. 30, 2004

(54) SEMICONDUCTOR LASER AND METHOD OF PRODUCTION THEREOF

(75) Inventors: Jugo Mitomo, Kanagawa (JP); Hironobu Narui, Kanagawa (JP)

(73) Assignee: Sony Corporation, Tokyo (JP)

( * ) Notice: Subject to any disclaimer, the term of this patent is extended or adjusted under 35 U.S.C. 154(b) by 238 days.

(21) Appl. No.: 09/934,930

(22) Filed: Aug. 22, 2001

(65) Prior Publication Data

US 2002/0080835 A1 Jun. 27, 2002

(30) Foreign Application Priority Data

Aug. 23, 2000 (JP) ..................................... P2000-258139

(51) Int. Cl.$^7$ ................................................. H01S 5/00
(52) U.S. Cl. .......................................... 372/46; 438/22
(58) Field of Search ........................ 372/43–50; 438/22

(56) References Cited

U.S. PATENT DOCUMENTS 5,568,500 A * 10/1996 Furuya et al. ................ 372/46

* cited by examiner

Primary Examiner—Quyen Leung
(74) Attorney, Agent, or Firm—Sonnenschein, Nath & Rosenthal LLP

(57) ABSTRACT

A window structure type AlGaInP semiconductor laser able to suppress abnormal growth in the vicinity of a ridge and having good surface morphology, wherein a least one step-like structure is provided on a substrate having a surface tilted to a [0-1-1] direction from a (100) plane, a semiconductor stack is formed on the substrate and comprises an active layer including two types of Group III elements including at least indium (In) and Group V elements including phosphorus (P), a cladding layer of a first conductivity, a cladding layer of a second conductivity, end surfaces of an active layer serve as end surfaces of a resonator, a light guide is formed between and the end surfaces of the resonator, and the light guide is arranged at an upper step side of the step-like structure so that a portion of the light guide not including resonator end surfaces is positioned in the vicinity of the step-like structure and so that the resonator end surface portions of the light guide are farther from the step-like structure, and a method of production thereof.

18 Claims, 21 Drawing Sheets

115 : n-Al$_{0.3}$Ga$_{0.7}$As
116 : GaInAs/Al$_{0.1}$Ga$_{0.9}$As
117 : p-Al$_{0.3}$Ga$_{0.7}$As
118 : p-GaAs

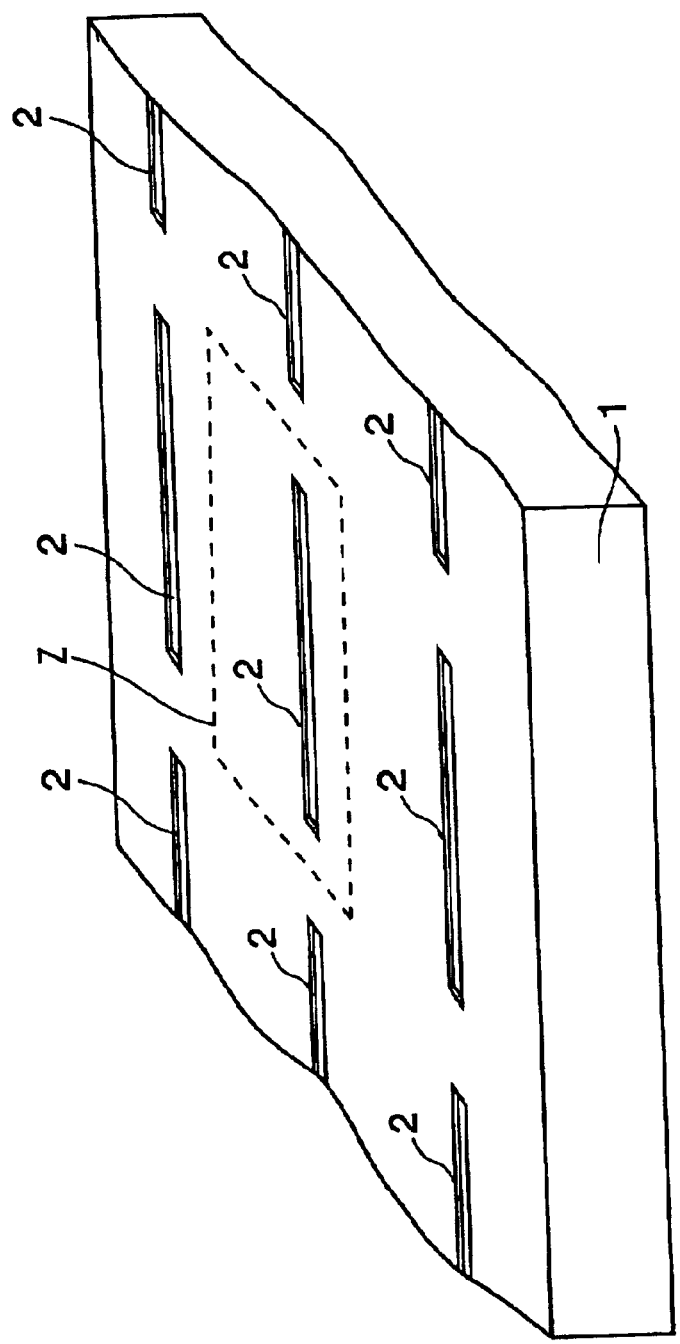

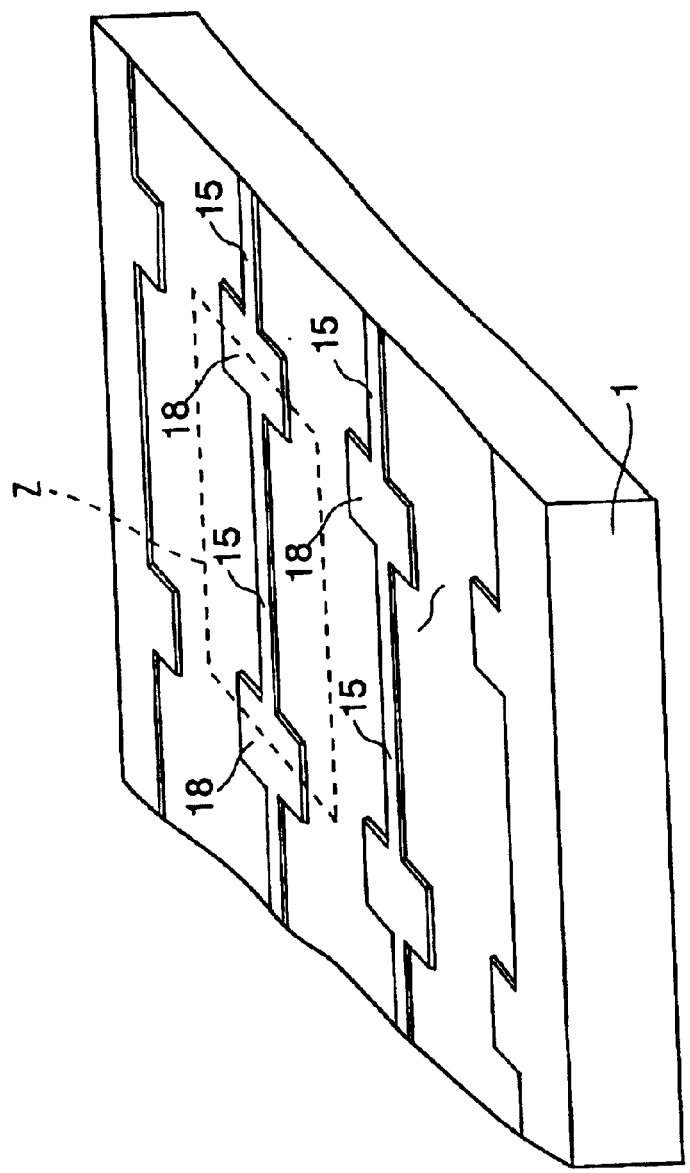

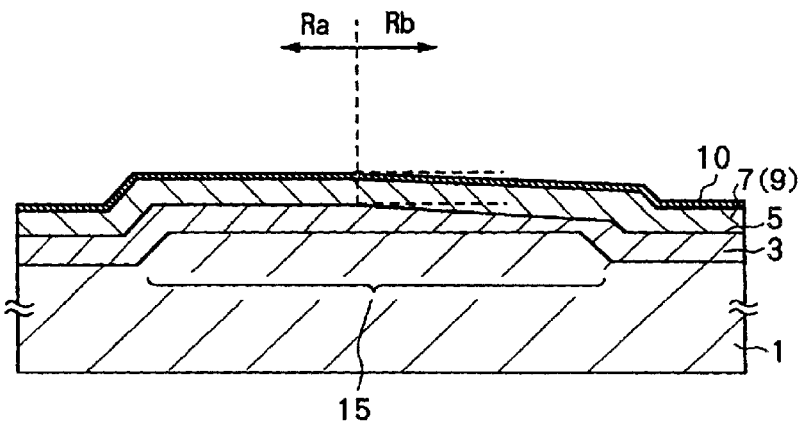
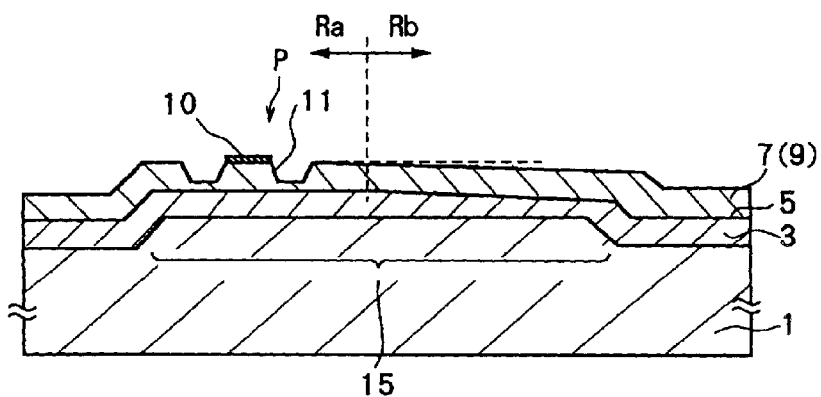

SEMICONDUCTOR LASER AND METHOD OF PRODUCTION THEREOF

RELATED APPLICATION DATA

The present invention claims priority to Japanese Application No. P2000-258139, filed Aug. 23, 2000, which application is incorporated herein by reference to the extent permitted by law.

BACKGROUND OF THE INVENTION

1. Field of the Invention

The present invention relates to a semiconductor laser used in optical disk systems, optic-magnetic disk memory systems, laser beam printers, and other optical information apparatuses and in optical communications and a method of production thereof, more particularly relates to a semiconductor laser of an oscillation wavelength in the visible light region of the 0.6 to 1.5 μm band and a method of production thereof.

2. Description of the Related Art

The maximum output of a semiconductor laser is limited by the catastrophic optical damage (COD) occurring along with a sharp rise of the temperature of the emission surface of the laser light due to the absorption of the laser light. As a high output semiconductor laser able to suppress the absorption of laser light and prevent COD, there is known a semiconductor laser of a window structure. In this window structure type semiconductor laser, a light guide layer of a bandgap larger than an active layer is provided at the emission surface side to suppress the absorption of the laser light.

When fabricating such a window structure type semiconductor laser, usually two times of growth processes are needed, but there is also a window structure type semiconductor laser that can be fabricated by one time of growth process.

For example, in the example disclosed in the Japanese Unexamined Patent Publication (Kokai) No. 6-232309, a ridge extending along a [01-1] direction is provided in advance in a portion (center portion) along a [01-1] direction of a GaAs (100) substrate (tilt angle: ±0.1°). On the substrate, an active layer comprised of a GaInAs/AlGaAs multi-quantum well layer and other layers of the laser structure are deposited by a single growth process using molecular beam epitaxy. The active layer comprised of the GaInAs/AlGaAs multi-quantum well layer formed on the ridge has a high concentration of In in the GaInAs layer and is thick, so the bandgap of the active layer is small only on the ridge. The active layer at the emission surface sides where the ridge is not provided has a relatively large bandgap compared with the active layer on the ridge, so a semiconductor laser of a window structure is realized.

Below, a method for producing such a window structure type semiconductor laser will be depicted.

FIG. 1 is a perspective view of the structure of a substrate for fabricating the above semiconductor laser.

A ridge 112 (height: 3 μm, width: 5 μm, length: 500 μm) extending along the [01-1] direction is formed at a portion (center portion) along a direction [01-1] on an n-type (100) GaAs substrate 111 (tilt angle: ±0.1°). Because of the ridge 112, the substrate 111 is separated into a ridge area 113 formed with the ridge 112 and two non-ridge areas 114 not formed with the ridge at the two sides of the ridge area 113. The length of each non-ridge area is 20 μm. Note that the ridge 112 is able to be formed by photolithography and etching using an etchant including buffered $HF:H_2O_2:H_2O$ (=10:1:10). In this case, the side surfaces 112a of the ridge 112 are the (311)A plane and the (3-1-1)A plane as reported in *Applied Physics Letters*, 54, pp. 433 (1989).

FIG. 2 and FIG. 3 are respectively a cross-sectional view and perspective view of a window structure type semiconductor laser fabricated using a substrate shown in FIG. 1. Below, the procedure for fabricating this semiconductor laser will be described.

First, an n-type $Al_{0.3}Ga_{0.7}As$ cladding layer 115 (thickness: 1 μm) is formed on the substrate 111 by molecular beam epitaxy at a substrate temperature of 550° C.

Next, a multi-quantum well layer 116 including a GaInAs layer (active layer) and a $Al_{0.1}Ga_{0.9}As$ layer (light guide layer) is formed by molecular beam epitaxy at a substrate temperature of 520° C.

Further, a p-type $Al_{0.3}Ga_{0.7}As$ cladding layer 117 (thickness: 1 μm) and a p-type GaAs cap layer 118 (thickness: 500 nm) are successively formed by molecular beam epitaxy at a substrate temperature of 550° C.

Here, the multi-quantum well layer 116 has a 5-cycle multi-quantum well layer. One cycle worth of the configuration in a non-ridge area 114 includes $Ga_{0.85}In_{0.15}As$ (thickness: 7 nm) and $Al_{0.1}Ga_{0.9}As$ (thickness: 7 nm).

After the above layers are grown, an electrode 119 is formed. In the ridge area 113, a ridge-shaped light guide having a width of 4 μm and extending along the [01-1] direction is formed as shown in FIG. 2 and FIG. 3 by patterning so that the center of the light guide coincides with the center of the ridge structure on the substrate 111. Then, this is cleaved at the center of the non-ridge areas 114 to produce a semiconductor laser having the (01-1) plane as the end surfaces of its resonator. By this, a window structure type semiconductor laser can be fabricated to have a 500 μm long active layer in the ridge area 113 and a 20 μm long light guide layer of an end surface of a resonator in each non-ridge area 114.

In the above description and as shown in *Applied Physics Letters*, 56, pp. 1939 (1990), when growing a multi-quantum well layer at a portion where a ridge is formed, the In atoms in a (311) plane and (3-1-1) plane diffuse into the (100) plane.

Therefore, compared with the multi-quantum well layer 116 grown in the non-ridge areas 114, the multi-quantum well layer 116 grown in the ridge area 113 has a high In concentration, a large thickness, and a narrow bandgap.

Therefore, the active layer at the emission surface sides has a relatively larger bandgap than the active layer on the ridge, so a window structure type semiconductor laser can be formed.

In the aforethe example of the related art, however, there is a disadvantage that the technique cannot be applied to an AlGaInP laser.

If a laser including P such as an AlGaInP laser is grown on a ridge stripe in the [01-1] direction as mentioned above, abnormal growth occurs around the ridge.

Because the growth rate declines in the region in the vicinity of the abnormal growth area, the growth rate on the ridge stripe declines and the thickness becomes smaller. If the thickness becomes small, the width of the well of the multi-quantum well layer becomes narrower, so the quantum level rises and the bandgap large becomes larger. On the other hand, the In concentration on the ridge stripe becomes higher regardless of abnormal growth, so the bandgap becomes small. There is therefore the disadvantage that the effects of the growth rate and the In concentration offset each other making it difficult to fabricate a window structure using a ridge stripe.

In addition, since the growth rate on the ridge stripe declines compared with that in a non-ridge area (for example, declines by 40% in the case of a ridge 30 $\mu$m in width and 2.7 $\mu$m in height), there also arises the disadvantage that a large deviation occurs in the positions of the active layer on a ridge stripe and the light guide layer in the non-ridge areas.

Due to this deviation, there are the problems that the light guide is distorted, the wave surface shifts, and the far field pattern becomes asymmetric.

Further, there is the problem that if an AlGaInP laser is formed on a GaAs (100) substrate that is not tilted, the surface morphology degrades.

SUMMARY OF THE INVENTION

An object of the present invention is to provide a window structure type semiconductor laser able to suppress abnormal growth in the vicinity of a ridge, having almost no decline in growth rate on a ridge stripe, and having a good surface morphology and a method of production thereof.

To attain the above object, according to a first aspect of the present invention, there is provided a semiconductor laser having a light guide between resonator end surfaces formed by end surfaces of an active layer, comprising a substrate having a surface tilted to a [0-1-1] direction from a (100) plane and a semiconductor stack formed on the substrate and comprising an active layer having two types of Group III elements including at least indium (In) and Group V elements including phosphorus (P) and a cladding layer of a first conductivity and a cladding layer of a second conductivity provided above and below the active layer, respectively, wherein at least one step-like structure is provided on the substrate and the light guide is provided at an upper step side of the step-like structure so that a portion of the light guide not including the resonator end surfaces is positioned in a vicinity of the step-like structure and so that a distance between the resonator end surfaces of the light guide and the step-like structure become greater than a distance between the portion of the light guide not including the resonator end surfaces and the step-like structure.

Preferably, the step-like structure is formed only in a vicinity of the portion of the light guide not including the resonator end surfaces.

Preferably, the step-like structure comprises a step difference of a groove provided in the substrate, and the light guide is arranged at an upper step side of the step difference of the groove so that the portion of the light guide not including the resonator end surfaces is positioned in a vicinity of the step difference of the groove and so that a distance between the resonator end surfaces of the light guide and the step difference of the groove become greater than a distance between the portion of the light guide not including the resonator end surfaces and the step difference of the groove.

More preferably, the groove is formed only in a vicinity of the portion of the light guide not including the resonator end surfaces.

Alternatively, more preferably, the distance between the resonator end surfaces of the light guide and the step difference of the groove are not more than 50 $\mu$m.

Preferably, the step-like structure comprises a ridge provided projecting out on the substrate and having a width at least that of the light guide and the light guide is arranged on the ridge so that the portion of the light guide not including the resonator end surfaces is positioned in a vicinity of a step difference of the ridge and so that distance between the resonator end surfaces of the light guide and the step difference of the ridge become greater than a distance between the portion of the light guide not including the resonator end surfaces and the step difference of the ridge.

More preferably, the substrate is provided with a first ridge having a width at least that of the light guide and extending along a direction in which the light guide extends and second ridges intersecting the first ridge, and the light guide is arranged on the first ridge so that the resonator end surfaces of the light guide are positioned in regions where the first ridge and the second ridges intersect.

Alternatively, more preferably, in the regions where the resonator end surfaces of the light guide are positioned, the ridge is formed wider than the region where the portion of the light guide not including the resonator end surfaces is positioned.

Alternatively, more preferably, the width of the ridge is not more than 100 $\mu$m.

Preferably, a direction of the resonator is a [01-1]direction of the substrate.

Alternatively, more preferably, an angle of an inclination to the [0-1-1] direction of the (100) plane of the substrate is 2° to 15°.

Alternatively, more preferably, the substrate comprises GaAs, GaP, or InP.

In the semiconductor laser according to the present invention, a bulk active layer or a multi-quantum well active layer having two types of Group III elements including at least indium (In) and Group V elements including phosphorus (P) is formed on a substrate on which at least one step-like structure is provided in the direction of the light guide in a region other than the resonator end surfaces and the light guide.

Concerning the above active layer, at the upper step side of the step-like structure, the In concentration in the active layer becomes higher the closer to the step-like structure and becomes lower the farther. Namely, the In concentration is high in the vicinity of the step-like structure, that is, the portion of the light guide not including the resonator end surfaces, so the bandgap becomes narrow in the active layer in the portion of the light guide not including the resonator end surfaces. On the other hand, the resonator end surface portions of the light guide are farther away from the step-like structure than the portion of the light guide not including the resonator end surfaces, so the bandgap at the resonator end surfaces is large compared with that in the portion of the light guide not including the resonator end surfaces. In this way, the window structure can be realized.

In addition, the above structure can be formed by one crystal growth process.

Further, because the substrate is tilted, the surface morphology is good, abnormal growth is also suppressed to a large extent, and there is almost no change of the growth rate between the vicinity of the step-like structure and the ends of the resonator. Therefore, there is no step difference of the light guide between the vicinity of the step-like structure and the ends of the resonator, and the problems of the shift of the wave surface, the asymmetry of the far field pattern, and so on do not arise.

Because the above step-like structure is formed only in the vicinity of the portion of the light guide not including the resonator end surfaces, the distance between the resonator end surface portions of the light guide and the step-like structure are larger than the distance between the portion of the light guide not including the resonator end surfaces and the step-like structure.

The step-like structure provided on the substrate can be made a step difference of a groove. For example, by forming the groove only in the vicinity of portion of the light guide not including resonator end surfaces, the distance between the resonator end surface portions of the light guide and the step-like structure are longer than the distance between the portion of the light guide not including resonator end surfaces and the step-like structure.

The step-like structure provided on the substrate can also be made a ridge provided projecting from the substrate.

In this case, the In concentration is high on the ridge. The In concentration becomes higher the narrower the ridge and lower the wider the ridge.

Therefore, for example, by providing first ridge extending along the direction in which the light guide extends and second ridges intersecting the first ridge, setting the second ridges wider than the first ridge, and arranging the light guide so that the resonator end surface portions of the light guide are positioned in regions where the first ridge and the second ridges intersect, that is, by cleaving at the second ridges, the bandgaps at the resonator end surfaces in the regions where the first and the second ridges intersect become larger compared with that on the first ridge, so the window regions are realized.

Further, as the shape of the ridge, by forming the ridge at the portions where the resonator end surface portions of the light guides are positioned wider than the region where the portion of the light guide not including resonator end surfaces is positioned, the bandgaps at the resonator end surfaces on the wide ridge can be made larger compared with an active layer on a relatively narrow ridge, so window structure can be realized.

To attain the above object, according to a second aspect of the present invention, there is provided a method for producing a semiconductor laser having a light guide between resonator end surfaces formed by end surfaces of an active layer, comprising the steps of providing at least one step-like structure on a substrate having a surface tilted to a [0-1-1] direction from a (100) plane and forming on the substrate a semiconductor stack having an active layer including two types of Group III elements including at least indium (In) and Group V elements including phosphorus (P) and a cladding layer of a first conductivity and a cladding layer of a second conductivity arranged above and below the active layer, respectively, wherein the light guide is provided at an upper step side of the step-like structure so that a portion of the light guide not including the resonator end surfaces is positioned in a vicinity of the step-like structure and so that distance between the resonator end surfaces of the light guide and the step-like structure become greater than a distance between the portion of the light guide not including the resonator end surfaces and the step-like structure.

Preferably, a groove is provided on the substrate as the step-like structure and the light guide is arranged at an upper step side of the groove so that the portion of the light guide not including the resonator end surfaces is positioned in a vicinity of the groove and so that a distance between the resonator end surface portions of the light guide and the groove are greater than a distance between the portion of the light guide not including the resonator end surfaces and the groove.

Preferably, the step of providing the step-like structure includes a step of providing a ridge that has a width at least that of the light guide projecting from the substrate and arranging the light guide on the ridge so that the portion of the light guide not including the resonator end surfaces is positioned in a vicinity of a step difference of the ridge and so that a distance between the resonator end surfaces of the light guide and the step difference of the ridge are greater than a distance between the portion of the light guide not including the resonator end surfaces and the step difference of the ridge.

Preferably, the step of providing the step-like structure includes a step of providing on the substrate a first ridge having a width at least that of the light guide and extending in a direction in which the light guide extends and second ridges having a width at least a width of the first ridge and intersecting the first ridge and, the step of forming the semiconductor stack includes a step of forming it on the substrate where the first and second ridges are formed by metal organic chemical vapor deposition (MOCVD) and further comprising a step of cleaving the substrate where the semiconductor stack is formed on the second ridges.

Further, more preferably, the first ridge is formed which extends in a [01-1] direction of the substrate and the second ridges are formed which extend in a [0-1-1] direction of the substrate.

Alternatively, the method further comprises, the step of cleaving the substrate on which the semiconductor stack is formed includes a step of cleaving the second ridges at a position at the light guide side from a center line equally dividing the second ridges in a extending direction of the second ridges.

The above method for producing a semiconductor laser according to the present invention provides at least one step-like structure on a substrate having a surface tilted to a [0-1-1] direction from a (100) plane, then forms a semiconductor stack comprising an active layer including two types of Group III elements including at least indium (In) and Group V elements including phosphorus (P) and a cladding layer of a first conductivity and a cladding layer of a second conductivity provided above and below the active layer, respectively.

Here, the light guide is arranged at the upper step side of the step-like structure so that a portion of the light guide not including resonator end surfaces is positioned in the vicinity of the step-like structure and so that the distance between the resonator end surface portions of the light guide and the step-like structure are greater than the distance between the portion of the light guide not including resonator end surfaces and the step-like structure.

According to the above method for producing a semiconductor laser according to the present invention, the In concentration is formed high in the vicinity of the step-like structure, so the bandgap can be formed narrow in the active layer in the vicinity of the step-like structure. On the other hand, the distance between the resonator end surface portion of the light guide and the step-like structure are greater than the distance between the portion of the light guide not including the resonator end surfaces and the step-like structure, so the bandgap at the resonator end surfaces is large compared with that in the active layer in the vicinity of the step-like structure. In this way, a window structure can be formed.

In addition, the above structure can be formed by one crystal growth process.

Further, because the substrate is tilted, the surface morphology is good, abnormal growth is also suppressed to a large extent, and there is almost no change of the growth rate between the vicinity of the step-like structure and the ends of the resonator. Therefore, there is no step difference of the light guide between the vicinity of the step-like structure and the ends of the resonator, and the problems of the shift of the wave surface, the asymmetry of the far field pattern, and so on do not arise.

In the above method for producing a semiconductor laser according to the present invention, the step-like structure provided on the substrate can be made a ridge projecting from the substrate.

In this case, by providing a first ridge extending along the direction in which the light guide extends and second ridges having a width at least that of the first ridge intersecting the first ridge, forming the semiconductor stack, then cleaving at the second ridges, the bandgap at the resonator end surfaces in the regions where the first and the second ridges intersect becomes larger compared with that on the first ridge, so a window structure can be realized.

Further, by cleaving the second ridges at a position at the light guide side from a center line equally dividing the second ridges in the extending direction of the second ridges, the width of the region forming the window structure at the resonator end surfaces is not constrained by the width of the second ridges and thus can be made shorter.

BRIEF DESCRIPTION OF THE DRAWINGS

The above object and features of the present invention will be more apparent from the following description of the preferred embodiments given with reference to the accompanying drawings, wherein:

FIG. 8 is a perspective view of a substrate used for fabricating a semiconductor laser according to Example 1;

FIG. 16 is a perspective view of a substrate used for fabricating a semiconductor laser according to Example 4;

FIGS. 18A and 18B are sectional views of a process of producing a semiconductor laser according to a modification;

DESCRIPTION OF THE PREFERRED EMBODIMENTS

Below, an explanation will be made of preferred embodiments of a semiconductor laser of the present invention and a method for producing the same with reference to the accompanying drawings.

First Embodiment

Figure 1:
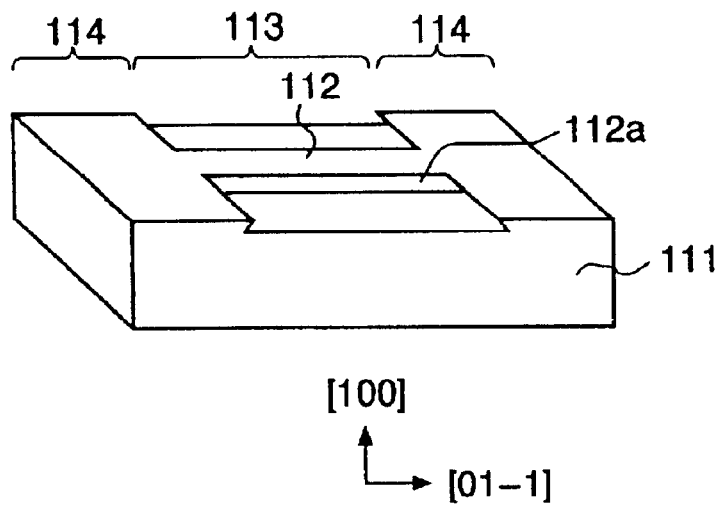
FIG. 1 is a perspective view of a substrate used for fabricating a semiconductor laser of the related art.
Figure 2:
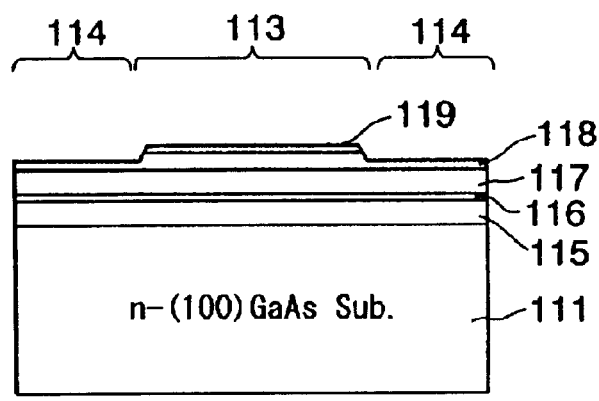
FIG. 2 is a sectional view of the configuration of a semiconductor laser of the related art.
Figure 3:
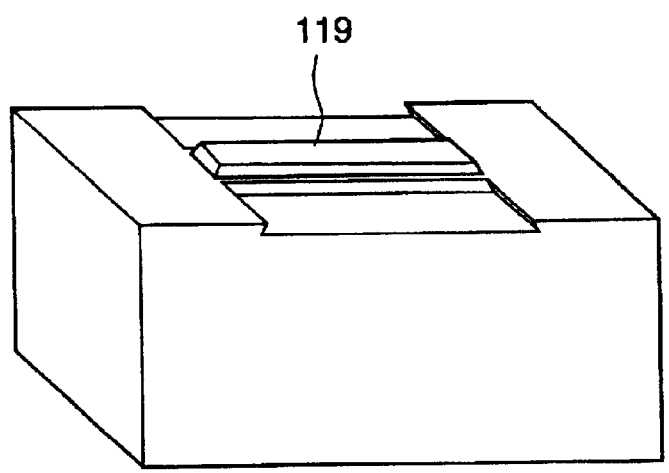
FIG. 3 is a perspective view of the configuration of the semiconductor laser of the related art.
Figure 4A:
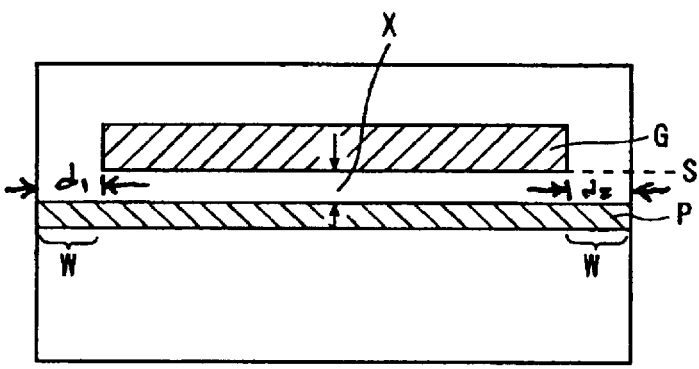
FIGS. 4A and 4B are top views of layouts of semiconductor lasers according to first and second embodiments, respectively.

FIG. 4A is a top view of the layout of a semiconductor laser according to a first embodiment.

For example, an n-type GaAs substrate tilted by a range from 2° to 15° to the [0-1-1] direction from the (100) plane is provided with a step-like structure comprised, for example, of a groove G extending in the [01-1] direction. The size of the groove G is made, for example, 2.7 $\mu$m in depth, 20 $\mu$m in width, and 630 $\mu$m in length.

The above substrate has stacked on it a semiconductor stack having an AlGaInP semiconductor or other active layer having two types of Group III elements including at least indium (In) and Group V elements including phosphorus (P) and a cladding layer of a first conductivity and a cladding layer of a second conductivity provided above and below the active layer, respectively.

In the above, end surfaces of the active layer in the semiconductor stack serve as end surfaces of the resonator, a light guide P of the semiconductor laser is formed between the resonator end surfaces, and laser light is emitted from the end surfaces of the resonator.

The light guide P is arranged at the upper step side of the step difference S of the groove G. The portion of the light guide not including the resonator end surfaces is positioned in the vicinity of the step difference S of the groove G so that the distance X between the portion of the light guide not including the resonator end surfaces and the step difference S is not more than 50 $\mu$m, for example, is 20 $\mu$m or so.

On the other hand, the light guide is arranged so that the distance between the resonator end surface portions of the light guide and the step difference S of the groove G become greater than the distance between the portion of the light guide not including the resonator end surfaces and the step differences of the groove G. For example, in the configuration shown in FIG. 4A, the groove G is not formed in the vicinity of the resonator end surface portions of the light guide P.

In the semiconductor laser having the above configuration, when an active layer having a multi-quantum well structure is grown on the substrate formed with the step difference S of the groove G, the In concentration in the active layer becomes higher the closer to the step difference S forming the periphery of the groove G and becomes lower the farther from it.

Therefore, the In concentration in the portion of the light guide not including the resonator end surfaces formed in the vicinity of the groove G is high, and the bandgap becomes narrow. On the other hand, the In concentration in the resonator end surface portions of the light guide formed away from the groove G is relatively low, and the bandgap becomes wide. In this way, window regions W are formed.

The above structure can be formed by one crystal growth process.

In addition, because the substrate is tilted, the surface morphology is good, abnormal growth is also suppressed to a large extent, and there is almost no change between the growth rate near the groove G and that at the ends of the resonator. Therefore, there is no step difference of the light guide between the vicinity of the groove G and the ends of the resonator, and the problems of the shift of the wave surface, asymmetry of the far field pattern, and so on do not arise.

Next, an explanation will be made of a method for fabricating a semiconductor laser of the present embodiment.

For example, an n-type GaAs substrate tilted by a 2° to 15° to the [0-1-1] direction from the (100) plane is formed with a groove G in the [01-1] direction by photolithography and etching. The groove G is, for example, 2.7 $\mu$m in depth, 20 $\mu$m in width, and 630 $\mu$m in length.

Next, the above substrate formed with the groove G is formed, for example, by MOCVD, with an AlGaInP semiconductor or other semiconductor stack having an active layer having two types of Group III elements including at least indium (In) and Group V elements including phosphorus (P) and a cladding layer of a first conductivity and a cladding layer of a second conductivity arranged above and below the active layer, respectively.

Next, a ridge stripe serving as the region for configuring the light guide P of the semiconductor laser is formed on the above semiconductor stack. On the ridge stripe, an electrode is formed. The substrate is cleaved at the plane forming the resonator ends, whereby a semiconductor laser having the above configuration is formed.

In the above semiconductor laser, the light guide P is arranged at the upper step side of the groove G so that the portion of the light guide not including the resonator end surfaces is positioned in the vicinity of the step difference S of the groove G so that the distance X between the portion of the light guide not including the resonator end surfaces and the step difference S is not more than 50 $\mu$m, for example, it is 20 $\mu$m or so.

On the other hand, the light guide P is arranged so that the distance between the resonator end surface portions of the light guide and the step difference S of the groove G becomes greater than the distance between the portion of the light guide not including the resonator end surfaces and the step difference S of the groove G. For example, as shown in FIG. 4A, the groove G is not formed in the vicinity of the resonator end surface portions of the light guide P.

According to the above fabrication method, the In concentration is high in the portion of the light guide not including the resonator end surfaces formed in the vicinity of the groove G, and the bandgap there becomes narrow. On the other hand, the In concentration is relatively low in the resonator end surface portions of the light guide formed away from the step difference S of the groove G, and the bandgap there becomes wide. These region become the window regions W.

The above structure can be formed by one crystal growth process.

In addition, because the substrate is tilted, the surface morphology is good, abnormal growth is also suppressed to a large extent, and there is almost no change between the growth rate near the groove G and that at the ends of the resonator. Therefore, there is no step difference of the light guide between the vicinity of the groove G and the ends of the resonator, and the problems of the shift of the wave surface, asymmetry of the far field pattern, and so on do not arise.

Second Embodiment

Figure 4B:
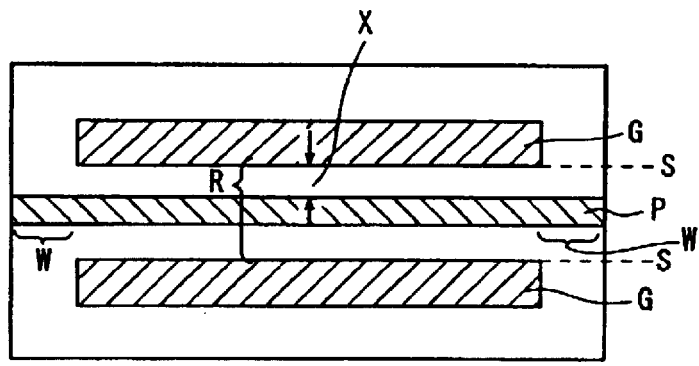

FIG. 4B is a top view of the layout of a semiconductor laser according to a second embodiment.

For example, an n-type GaAs substrate tilted by a range from 2° to 15° to the [0-1-1] direction from the (100) plane is formed with step-like structures comprised, for example, of two grooves G extending in the [01-1] direction. The projecting region sandwiched by the two grooves on the substrate becomes a ridge R. The width of the ridge R is the same as that of the light guide of the semiconductor laser.

The above substrate formed with a ridge is formed with, in the same way as the first embodiment, an AlGaInP semiconductor or other semiconductor stack having an active layer including two types of Group III elements including at least indium (In) and Group V elements including phosphorus (P) and a cladding layer of a first conductivity and a cladding layer of a second conductivity arranged above and below the active layer, respectively.

In the above, end surfaces of the active layer in the semiconductor stack serve as end surfaces of the resonator, a light guide P of the semiconductor laser is formed between the end surfaces of the resonator, and laser light is emitted from the end surfaces of the resonator.

The light guide P is arranged on the ridge R so that the portion of the light guide not including the resonator end surfaces is positioned in the vicinity of the step differences S of the ridge R so that the distance X between the portion of the light guide not including the resonator end surfaces and the step differences S of the ridge R is not more than 50 $\mu$m, for example, is 20 $\mu$m or so.

Here, it is not necessary to position the light guide P at the center of the ridge R. When necessary, it can be positioned close to the step difference S on one side of the ridge R.

In order to realize the above configuration, for example, the width of the ridge is set to 100 $\mu$m or less.

On the other hand, the light guide is arranged so that the distance between the resonator end surface portions of the light guide and the step differences S of the ridge R become greater than the distance between the portion of the light guide not including the resonator end surfaces and the step differences S of the ridge R. For example, as shown in FIG. 4B, the grooves G are not formed in the vicinity of the resonator end surface portions of the light guide P, namely, step differences S of the ridge R are not formed there.

In the semiconductor laser having the above configuration, when an active layer having a multi-quantum well structure is grown on the substrate having the ridge R formed by the two grooves G, the In concentration in the active layer becomes higher the closer to the step differences S of the ridge R, and becomes lower the farther from them.

Therefore, the In concentration in the portion of the light guide not including the resonator end surfaces formed in the vicinity of the step differences S of the ridge R is high, and the bandgap becomes narrow. On the other hand, the In concentration in the resonator end surface portions of the light guide formed away from the step differences S of the ridge R is relatively low, and the bandgap becomes wide. These region become the window regions W.

The above semiconductor laser of the present embodiment can be fabricated in the same way as that in the first embodiment.

For example, an n-type GaAs substrate tilted by 2° to 15° to the [0-1-1] direction from the (100) plane is formed, for example, by MOCVD, with two grooves G in the [01-1] direction, is formed with an AlGaInP semiconductor or other semiconductor stack having an active layer including two types of Group III elements including at least indium (In) and Group V elements including phosphorus (P) and a cladding layer of a first conductivity and a cladding layer of a second conductivity arranged above and below the active layer, respectively, is formed on the above semiconductor stack with a ridge stripe serving as the region for configuring the light guide P of the semiconductor laser, is formed on the ridge stripe with an electrode, and is cleaved at the plane forming the resonator ends to form a semiconductor laser having the above configuration.

In the above semiconductor laser, the light guide P is arranged on the ridge R so that the portion of the light guide not including the resonator end surfaces is positioned in the vicinity of the step differences S of the ridge R so that the distance X between the portion of the light guide not including the resonator end surfaces and the step differences S of the ridge R is not more than 50 µm, for example, is 20 µm or so and so the distance between the resonator end surface portions of the light guide and the step differences S of the ridge R become greater than the distance between the portion of the light guide not including the resonator end surfaces and the step differences S of the groove G. For example, as shown in FIG. 4B, the two grooves G are not formed in the vicinity of the resonator end surface portions.

According to the above fabrication method, the In concentration is high in the portion of the light guide not including the resonator end surfaces formed in the vicinity of the step differences S of the ridge R due to the grooves G, and the bandgap there becomes narrow. On the other hand, the In concentration is relatively low in the resonator end surface portions of the light guide formed away from the step differences S of the ridge R due to the grooves G, and the bandgap there becomes wide. These region become the window regions W.

The above structure can be formed by one crystal growth process.

In addition, because the substrate is tilted, the surface morphology is good, abnormal growth is also suppressed to a large extent, and there is almost no change between the growth rate near the groove G and that at the ends of the resonator. Therefore, there is no step difference of the light guide between the vicinity of the groove G and the ends of the resonator, and the problems of the shift of the wave surface, asymmetry of the far field pattern, and so on do not arise.

Third Embodiment

Figure 5A:
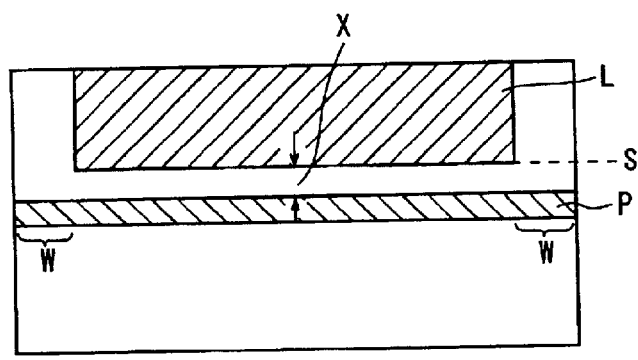
FIGS. 5A and 5B are top views of layouts of semiconductor lasers according to third and fourth embodiments, respectively.

FIG. 5A is a top view of the layout of a semiconductor laser according to a third embodiment.

The third embodiment is substantially the same as the first embodiment, but is different in that a low surface region L is formed instead of the groove formed in the first embodiment.

The substrate surface of the low surface region L is formed lower than other regions by for example 2.7 µm, so a step difference S is formed at the edge of the low surface region.

The light guide P of the semiconductor is arranged at the upper step side of the step difference S so that the portion of the light guide not including the resonator end surfaces is positioned in the vicinity of the step difference S so that the distance X between the portion of the light guide not including the resonator end surfaces and the step difference S is not more than 50 µm, for example, becomes 20 µm or so and so that the distance between the resonator end surface portions of the light guide and the step difference S become greater than the distance between the portion of the light guide not including the resonator end surfaces and the step difference S. For example, as shown in FIG. 5A, the edges of the low surface region L can be arranged to bend away from the light guide so that the step difference S is not formed in the vicinity of the resonator end surface portions of the light guide.

Also in the semiconductor laser having the above configuration, when an active layer having a multi-quantum well structure is grown on the substrate formed with the step difference S, the In concentration in the active layer becomes higher the closer to the step difference S and becomes lower the farther from it. Consequently, the In concentration is high in the portion of the light guide not including the resonator end surfaces formed in the vicinity of the step difference S, and the bandgap becomes narrow. On the other hand, the In concentration is relatively low in the resonator end surface portions of the light guide formed far away from the step difference S, and the bandgap becomes wide. These regions becomes the window regions W.

Fourth Embodiment

Figure 5B:
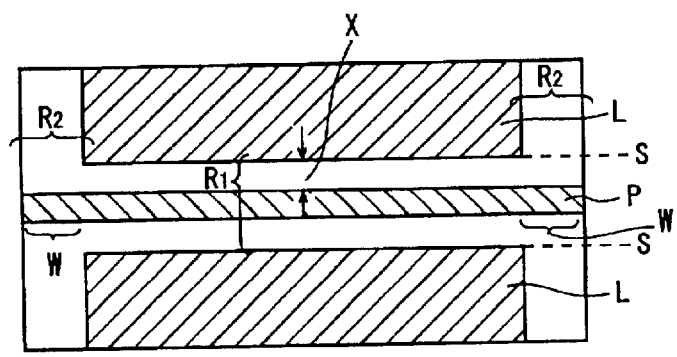

FIG. 5B is a top view of the layout of a semiconductor laser according to a fourth embodiment.

The fourth embodiment is substantially the same as the second embodiment, but is different in that a pair of low surface regions L are provided instead of the two grooves formed in the second embodiment and a first ridge is formed in the region between the pair of low surface regions.

In addition, the edges of the low surface regions L are bent away from the light guide so that step differences S are not formed in the vicinity of the resonator end surface portions of the light guide. Therefore, second ridges intersecting the first ridge R1 are provided at the resonator end surface portions of the light guide.

In the same way as the third embodiment, the substrate surfaces of the low surface regions L are formed lower than other regions by for example 2.7 µm, so step differences S are formed at the edges of the low surface regions.

The light guide P of the semiconductor is arranged on the first ridge R1 so that the portion of the light guide not including the resonator end surfaces is positioned in the vicinity of the step difference S of the first ridge R1 so that the distance X between the portion of the light guide not including the resonator end surfaces and the step differences S of the first ridge R is not more than 50 µm, for example, 20 μm or so and so that the step differences S are not in the vicinity of the resonator end surface portions of the light guide.

In the semiconductor laser having the above configuration as well, when an active layer having a multi-quantum well structure is grown on the substrate formed with the first ridge R1 and the second ridge R2, the In concentration in the active layer becomes higher the closer to the ridge step differences S and becomes lower the farther from them. Consequently, the In concentration is high in the portion of the light guide not including the resonator end surfaces formed in the vicinity of the step differences S of the first ridge R1, and the bandgap becomes narrow. On the other hand, the In concentration is relatively low in the resonator end surface portions of the light guide formed far away from the ridge step differences S, and the bandgap becomes wide. These region become the window regions W.

In the above semiconductor laser, the substrate is cleaved at the second ridges, so in the process of fabricating the active layer, it is possible to design the second ridges to have a width larger than the above value. In this case, it is possible to make the In concentration on the first and the second ridges further larger to design a window structure of a large energy gap.

Fifth Embodiment

Figure 6A:
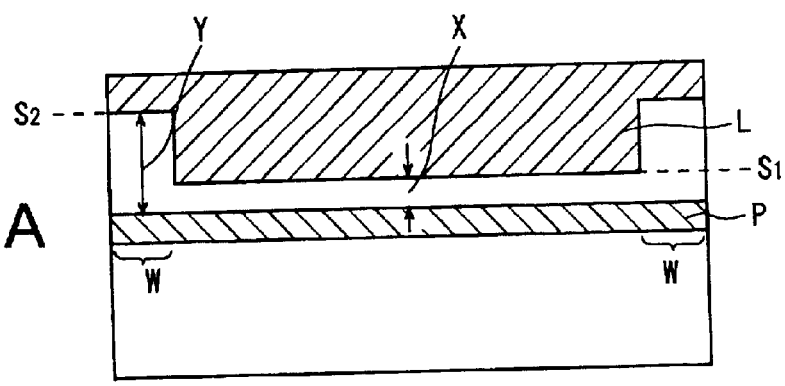
FIGS. 6A and 6B are top views of layouts of semiconductor lasers according to fifth and sixth embodiments, respectively.

FIG. 6A is a top view of the layout of a semiconductor laser according to a fifth embodiment.

The fifth embodiment is substantially the same as the third embodiment, but the edges of the low surface region L are bent away from the light guide and then bent again to a direction parallel with the direction of the resonator so that the step difference S is not formed in the vicinity of the resonator end surface portions of the light guide P.

That is, the light guide is arranged so that the portion of the light guide not including the resonator end surfaces is positioned in the vicinity of the step difference S1 so that the distance X between the portion of the light guide not including the resonator end surfaces and the step difference S1 is not more than 50 μm, for example, is 20 μm or so and so that the distance Y between the resonator end surface portions of the light guide P and the step differences S2 become greater than the distance between the portion of the light guide not including the resonator end surfaces and the step differences S2.

In the semiconductor laser having the above configuration as well, when an active layer having a multi-quantum well structure is grown on the substrate formed with the step difference S, the In concentration in the active layer becomes higher the closer to the step difference S and becomes lower the farther from it. Consequently, the In concentration is high in the portion of the light guide not including the resonator end surfaces formed in the vicinity of the step difference S, and the bandgap becomes narrow. On the other hand, the In concentration is relatively low in the resonator end surface portions of the light guide formed far away from the step difference S, and the bandgap becomes wide. These region become the window regions W.

Sixth Embodiment

Figure 6B:
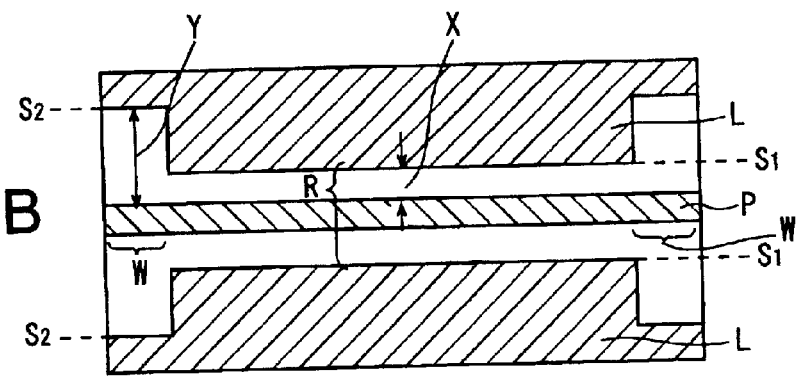

FIG. 6B is a top view of the layout of a semiconductor laser according to a sixth embodiment.

The sixth embodiment is substantially the same as the fourth embodiment, but is different in that only one ridge stripe R is formed instead of the first and second ridges formed in the fourth embodiment and in that the ridge width in the vicinity of the resonator end surface portions of the light guide P is larger than the width of the portion of the light guide not including the resonator end surfaces P.

That is, the light guide is arranged so that the portion of the light guide not including the resonator end surfaces is positioned in the vicinity of the step difference S1 so that the distance X between the portion of the light guide not including the resonator end surfaces and the step differences S1 of the ridge R is not more than 50 μm, for example, is 20 μm or so and so that the distance Y between the resonator end surface portions of the light guide P and the step differences S2 at the portions of the ridge having a larger width become greater than the above distance X.

In the semiconductor laser having the above configuration as well, when an active layer having a multi-quantum well structure is grown on the substrate formed with the ridge R, the In concentration in the active layer becomes higher the closer to the step differences S of the ridge R and becomes lower the farther from them. Consequently, the In concentration is high in the portion of the light guide not including the resonator end surfaces formed in the vicinity of the step differences S1 of the portion of the ridge R having a small width, and the bandgap becomes narrow. On the other hand, the In concentration is relatively low in the resonator end surface portions of the light guide formed far away from the step differences S2 of the portions of the ridge R having a large width, and the bandgap becomes wide. These regions can be made the window regions W.

EXAMPLE 1

Figure 7A:
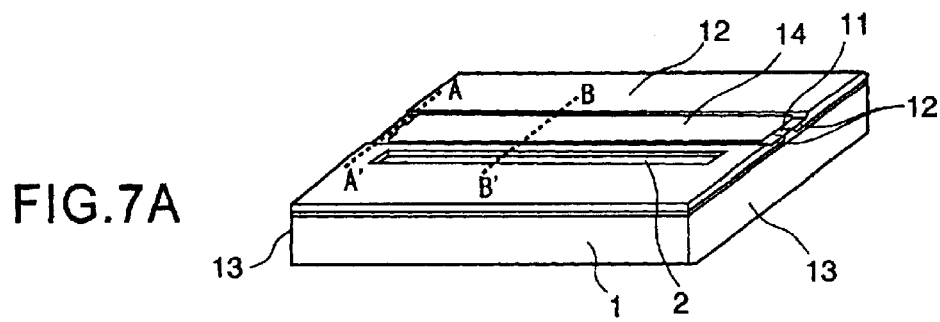
FIGS. 7A to 7C are a perspective view of a configuration of a semiconductor laser according to Example 1, a sectional view of an end surface of a resonator, and a sectional view of the center of the resonator, respectively.
Figure 7B:
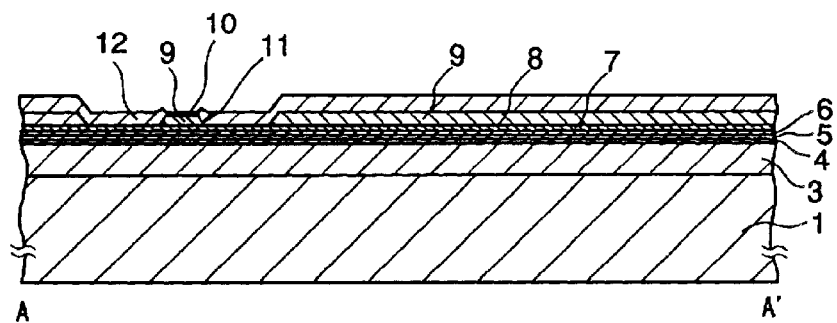
Figure 7C:
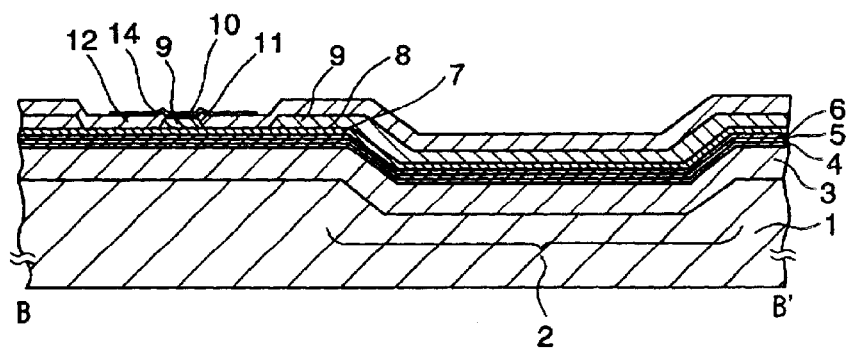

FIGS. 7A to 7C are a perspective view of the configuration of a semiconductor laser according to the first Example, a sectional view along the A–A' line in FIG. 7A, and a sectional view along the B–B' line in FIG. 7A, respectively.

An n-type GaAs substrate tilted by 10° to the [0-1-1] direction from the (100) plane is formed in the direction [01-1] with a groove 2 to be 2.7 μm in depth, 20 μm in width, and 630 μm in length. Over this is deposited an n-type $(Al_{0.7}Ga_{0.3})_{0.5}In_{0.5}P$ cladding layer 3 of a thickness of 1.1 μm, an $(Al_{0.5}Ga_{0.5})_{0.5}In_{0.5}P$ guide layer 4, an active layer 5 having a multi-quantum well structure comprising $Ga_{0.5}In_{0.5}P/(Al_{0.5}Ga_{0.5})_{0.5}In_{0.5}P$, an $(Al_{0.5}Ga_{0.5})_{0.5}In_{0.5}P$ guide layer 6, a p-type $(Al_{0.7}Ga_{0.3})_{0.5}In_{0.5}P$ cladding layer 7 of a thickness of 0.3 μm, a p-type $Ga_{0.5}In_{0.5}P$ etching stopper layer 8, a p-type $(Al_{0.7}Ga_{0.3})_{0.5}In_{0.5}P$ cladding layer 9 of a thickness of 1.1 μm, and a p-type GaAs cap layer 10 of a thickness of 0.35 μm.

The above multi-quantum well layer 5 is comprised of a 3-cycle multi-quantum well structure. One-cycle worth of the configuration includes a $Ga_{0.5}In_{0.5}P$ film of a thickness of 3.5 nm and an $(Al_{0.5}Ga_{0.5})_{0.5}In_{0.5}P$ film of a thickness of 4.0 μm.

In the above semiconductor stack, a ridge stripe 11 of a width of 3 μm is formed along the [01-1] direction at the depth to which the etching stopper layer 8 reaches at a position 20 μm away from the groove 2. An n-type buried layer 12 comprised of a GaAs layer is formed over the entire surface of this resulting in an index guide structure. In addition, an electrode 14 is formed on the p-type cap layer 10 and the n-type buried layer 12 so as to be connected to the p-type cap layer 10.

The above semiconductor stack is cleaved at the (01-1) plane perpendicular to the length direction of the ridge stripe 11. The end surfaces of the above active layer 5 in the region of the ridge stripe 11 becomes end surfaces of a resonator, whereby a light guide is formed between the end surfaces of the resonator. The length of the resonator is 700 μm.

Here, the groove 2 is not formed in the vicinity of the resonator end surface portions of the light guide (ranges within 35 μm from the resonator end surfaces 13), but is formed only in the vicinity of the portion of the light guide not including the resonator end surfaces (range at least 35 μm away from the resonator end surfaces 13). That is, the light guide is arranged so that the portion of the light guide not including the resonator end surfaces is positioned as close as 20 μm to the groove 2 and so that the distance between the resonator end surface portions of the light guide and the groove 2 are larger than the distance between the portion of the light guide not including the resonator end surfaces and the groove 2.

Further, the electrode 14 is 650 μm long and is not formed in the vicinity of the resonator end surface 13 (ranges within 25 μm from the resonator end surfaces 13), so there is no current injection.

In the semiconductor laser having the above configuration, when the active layer 5 having a multi-quantum well structure is grown on the substrate 1 formed with the groove 2, the In concentration in the active layer 5 becomes higher the closer to the groove 2 and becomes lower the farther from it.

Consequently, the In concentration is high in the portion of the light guide not including the resonator end surfaces formed in the vicinity of the groove 2 (range at least 35 μm away from the resonator end surfaces 13), and the bandgap becomes narrow. On the other hand, the In concentration is relatively low in the resonator end surface portions of the light guide formed far from the groove 2 (ranges within 35 μm from the resonator end surfaces 13), and the bandgap becomes wide.

As explained above, a semiconductor laser is formed having a window structure in which the bandgap is wide in the range 35 μm away from the resonator end surfaces and having no current injection into the window structure.

In addition, the above structure can be formed by one crystal growth process.

Further, because the substrate is tilted, the surface morphology is good, abnormal growth is also suppressed to a large extent, and there is almost no change between the growth rate near the groove and that at the ends of the resonator. Therefore, there is no step difference of the light guide between the region near the groove and the ends of the resonator, and the problems of the shift of the wave surface, asymmetry of the far field pattern, and so on do not arise.

Next, an explanation will be made of a method for fabricating a semiconductor laser of the above example.

FIG. 8 is a perspective view of a substrate used for fabricating a semiconductor laser according to the present example.

An n-type GaAs substrate 1 tilted by 10° to the [0-1-1] direction from the (100) plane is formed at a portion (center portion) along a direction [0, 1-1] with grooves 2, each of which is 2.7 μm in depth, 20 μm in width, and 630 μm in length, in the [01-1] direction at a cycle of 700 μm in the [01-1] direction and a cycle of 300 μm in the [0-1-1] direction. These grooves can be formed by photolithography and etching using an etchant of $H_2SO_4:H_2O_2:H_2O$.

In addition, in FIG. 8, the region ultimately forming a semiconductor laser element is indicated by "Z".

The above substrate 1 formed with the grooves 2 is formed by MOCVD with an n-type $(Al_{0.7}Ga_{0.3})_{0.5}In_{0.5}P$ cladding layer 3 of a thickness of 1.1 μm, an $(Al_{0.5}Ga_{0.5})_{0.5}In_{0.5}P$ guide layer 4, an active layer 5 having a multi-quantum well structure comprising $Ga_{0.5}In_{0.5}P/(Al_{0.5}Ga_{0.5})_{0.5}In_{0.5}P$, an $(Al_{0.5}Ga_{0.5})_{0.5}In_{0.5}P$ guide layer 6, a p-type $(Al_{0.7}Ga_{0.3})_{0.5}In_{0.5}$ P cladding layer 7 of a thickness of 0.3 μm, a p-type $Ga_{0.5}In_{0.5}P$ etching stopper layer 8, a p-type $(Al_{0.7}Ga_{0.3})_{0.5}In_{0.5}P$ cladding layer 9 of a thickness of 1.1 μm, and a p-type GaAs cap layer 10 of a thickness of 0.35 μm successively at a substrate temperature of 690° C.

Next, using the etching stopper layer 8, a ridge stripe of a width of 3 μm is formed in the [01-1] direction 20 μm away from the groove 2 by photolithography and wet etching. Further, by MOCVD, an n-type GaAs buried layer 12 is formed over the entire surface.

Next, an electrode 14 is formed on the p-type cap layer 10 and the n-type buried layer 12 to be connected to the p-type cap layer 10 in the portion not including the resonator end surfaces 13 (ranges within 25 μm from the resonator end surfaces 13). The electrode 14 is 650 μm long. The ranges within 25 μm from the resonator end surfaces 13 are made regions without current injection.

Next, the substrate is cleaved at the (01-1) plane at the center between grooves 2 to separate elements at the (0-1-1) plane at the center between ridge stripes of index guides. In this way, the semiconductor laser as shown in FIGS. 7A to 7C is fabricated.

In the above way, a semiconductor laser is formed having a window structure in which the bandgap is wide in a range within 35 μm from the resonator end surfaces and having no current injection in the window structure.

In addition, the above structure can be formed by one crystal growth process. Further, because use is made of the substrate 1 that is tilted relative to the (100) plane, abnormal growth is also suppressed to a large extent in the vicinity of the grooves, and there is little change between the growth rate near the groove and that at the ends of the resonator. Therefore, there is no step difference of the light guide, and the problems of the shift of the wave surface, asymmetry of the far field pattern, and so on do not arise.

EXAMPLE 2

Figure 9:
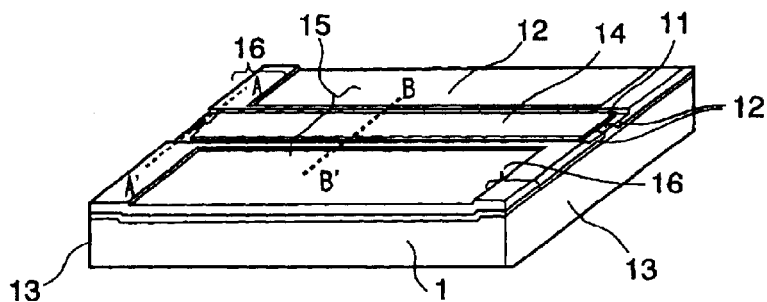
FIGS. 9A to 9C are a perspective view of the configuration of a semiconductor laser according to Example 2, a sectional view of an end surface of a resonator, and a sectional view of the center of the resonator, respectively.
Figure 9:
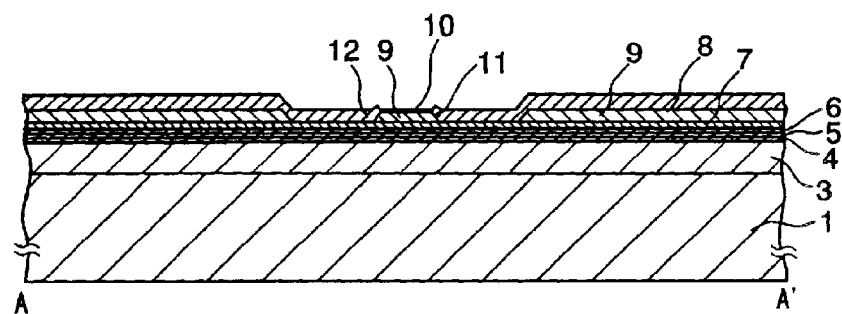
Figure 9:
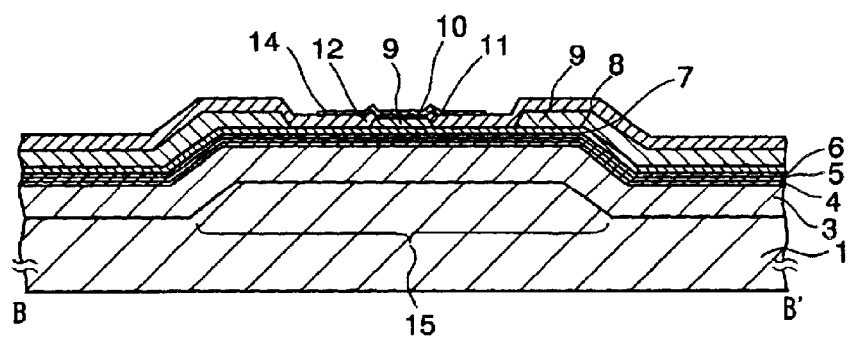

FIGS. 9A to 9C are a perspective view of the configuration of a semiconductor laser according to Example 2, a sectional view along the A–A' line in FIG. 9A, and a sectional view along the B–B' line in FIG. 9A, respectively.

A first ridge 15 is formed extending in the direction [01-1] of an n-type GaAs substrate 1 tilted by 10° to the [0-1-1] direction from the (100) plane and is 2.7 μm in height and 20 μm in width, while second ridges 16 are formed extending in the direction [0-1-1] and are 2.7 μm in height and 35 μm in width.

On the above substrate, a semiconductor stack the same as that in Example 1 is deposited.

In the above semiconductor stack, a ridge stripe 11 of a width of 3 μm is formed along the [01-1] direction at the depth to which the etching stopper layer 8 reaches at the center of the first ridge 15. An n-type GaAs buried layer 12 is formed over the entire surface resulting in an index guide structure. In addition, an electrode 14 is formed on the p-type cap layer 10 and the n-type buried layer 12 to be connected to the p-type cap layer 10.

The above semiconductor stack is cleaved at the (01-1) plane perpendicular to the length direction of the ridge stripe 11. The end surfaces of the above active layer 5 in the region of the ridge stripe 11 become end surfaces of a resonator, whereby a light guide is formed between the end surfaces of the resonator. The length of the resonator is 700 μm.

Further, the electrode 14 is 650 μm long. The electrode 14 is not formed in the vicinity of the resonator end surfaces 13 (ranges within 25 μm from the resonator end surfaces 13), so there is no current injection.

Next, an explanation will be made of a method for fabricating a semiconductor laser of the above example.

Figure 10:
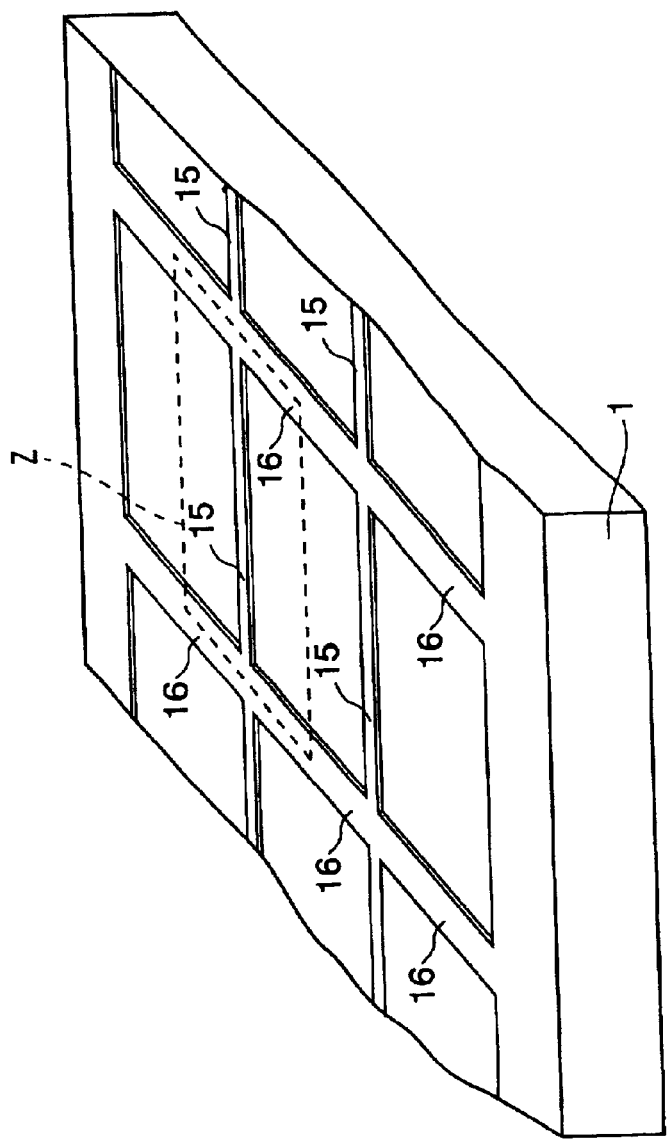
FIG. 10 is a perspective view of a substrate used for fabricating a semiconductor laser according to Example 2.

FIG. 10 is a perspective view of a substrate used for fabricating a semiconductor laser according to the present example.

An n-type GaAs substrate 1 tilted by 10° to the [0-1-1] direction from the (100) plane is formed with first ridges 15 extending in the [01-1] direction and being 2.7 μm in height and 20 μm in width and second ridges 16 extending in the [0-1-1] direction and being 2.7 μm in height and 70 μm in width. The cycle of the first ridges 15 is 300 μm, and that of the second ridges 16 is 700 μm. These ridges can be formed by photolithography and etching using an etchant of $H_2SO_4:H_2O_2:H_2O$.

In addition, in FIG. 10, the region ultimately forming a semiconductor laser element is indicated by "Z".

The above substrate 1 formed with the first and second ridges 15, 16, in the same way as Example 1, is deposited by MOCVD with a semiconductor stack at a substrate temperature of 690° C.

Next, using the etching stopper layer 8, a ridge stripe of a width of 3 μm is formed in the [01-1] direction at the center of the first ridge 15 by photolithography and wet etching. Further, by MOCVD, an n-type GaAs buried layer 12 is formed over the entire surface.

Next, an electrode 14 is formed on the p-type cap layer 10 and the n-type buried layer 12 to be connected to the p-type cap layer 10 in the portion not including the resonator end surfaces 13 (ranges within 25 μm from the resonator end surface 13). The electrode 14 is 650 μm long. The ranges within 25 μm from the resonator end surfaces 13 are made regions without current injection.

Next, the substrate is cleaved at the (01-1) plane at the center of the second ridges 16 in the [0-1-1] direction to separate elements at the (0-1-1) plane at the center of the first ridge in the [01-1] direction. In this way, the semiconductor laser as shown in FIGS. 9A to 9C is fabricated.

In the semiconductor laser having the above configuration, when the active layer 5 having a multi-quantum well structure is grown on the substrate 1 formed with the first ridge 15 and the second ridges 16, the In concentration on the ridges becomes high. The In concentration becomes higher the narrower the ridge and the lower the wider the ridge.

Consequently, the In concentration can be formed high in the active layer 5 of the index guide laser formed in the first ridge 15 of a width of 20 μm and in the [01-1] direction, and the bandgap can be formed narrow. The In concentration can be formed relatively low in the active layer 5 formed in the second ridges 16 of a width of 70 μm and in the [0-1-1] direction, and the bandgap can be formed wide.

In the above way, a semiconductor laser is formed having a window structure in which the bandgap is wide in ranges within 35 μm from the resonator end surfaces and having no current injection in the window structure.

In addition, the above structure can be formed by one crystal growth process. Further, because the substrate is tilted, abnormal growth around the first and the second ridges is also suppressed to a large extent, and there is almost no change between the growth rate on the first ridge 15 and that at the resonator end surfaces 13. Therefore, there is no step difference of the light guide between the region near the groove and the end surfaces of the resonator, and the problems of the shift of the wave surface, asymmetry of the far field pattern, and so on do not arise.

Figure 11:
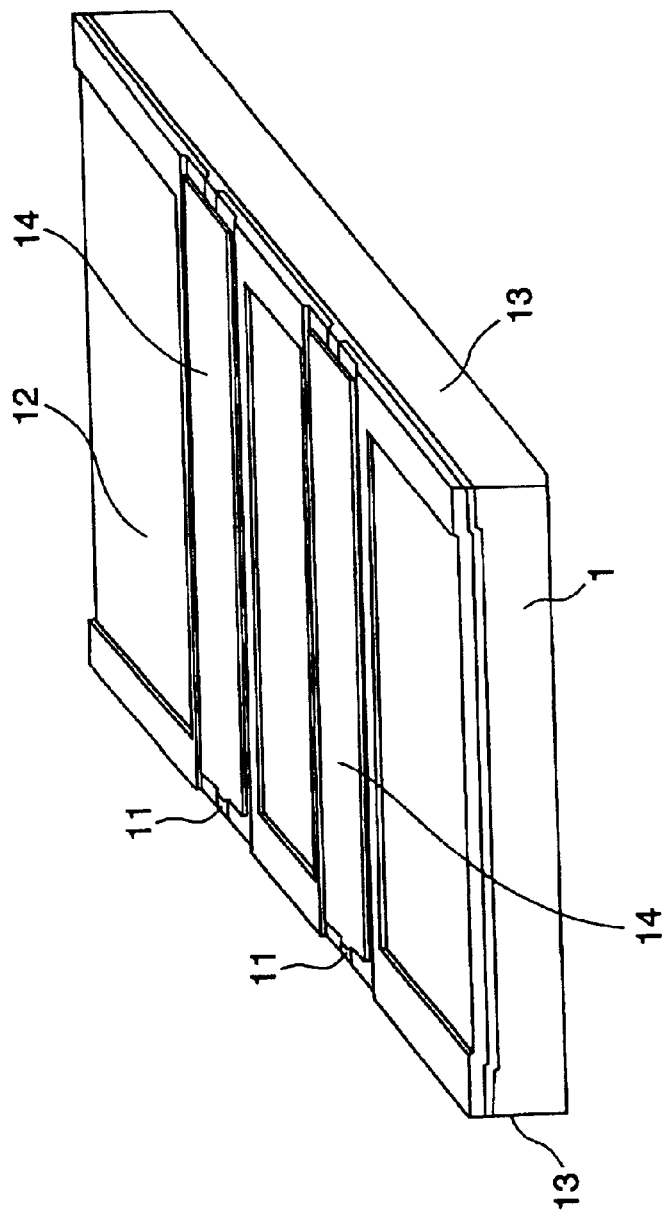
FIG. 11 is a perspective view of another configuration of a semiconductor laser according to Example 2.

Note that in Example 2, the description was made of the case of formation of one first ridge 15 in the [01-1] direction as shown in FIG. 9A, but two or more first ridges 15 may also be formed as shown in FIG. 11.

Figure 12:
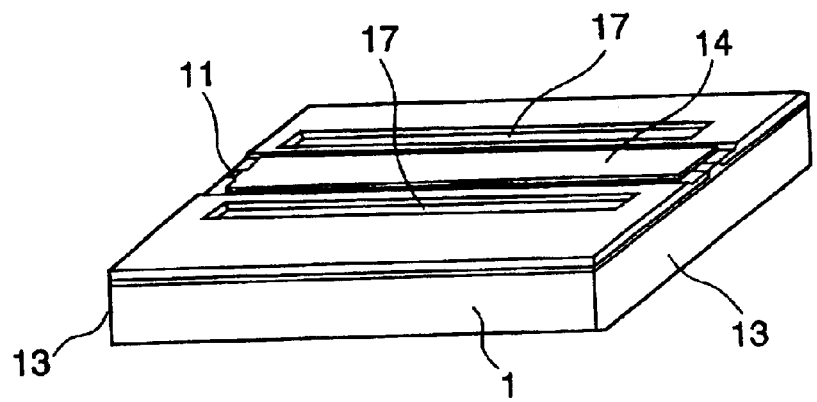
FIG. 12 is a perspective view of another configuration of a semiconductor laser according to Example 2.

Further, as shown in FIG. 12, two grooves 17 may also be provided in order to form the first ridge 15 in the [01-1] direction.

EXAMPLE 3

Figure 13:
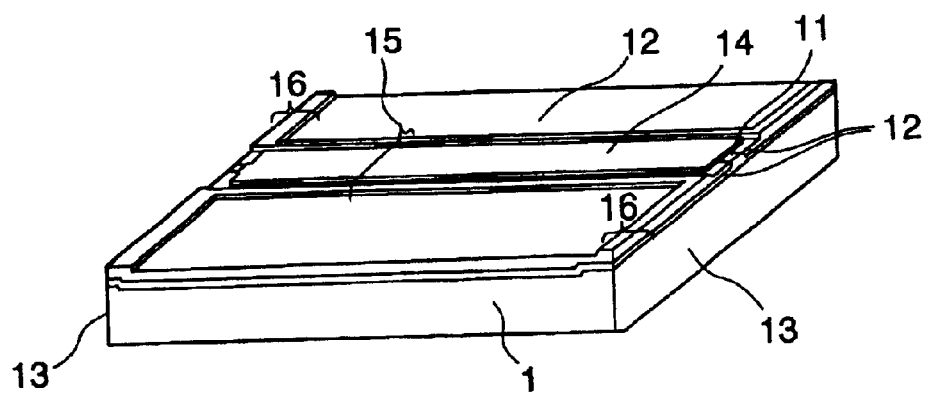
FIG. 13 is a perspective view of the configuration of a semiconductor laser according to Example 3.

FIG. 13 is a perspective view of the configuration of a semiconductor laser according to Example 3. This example is substantially the same as Example 2. It sectional views are the same as FIG. 9B and FIG. 9C. The widths of the second ridges 16 extending in the [0-1-1] direction are however 20 μm or narrower than in Example 2.

An explanation will next be made of a method for fabricating the semiconductor laser according to the present example.

Figure 14:
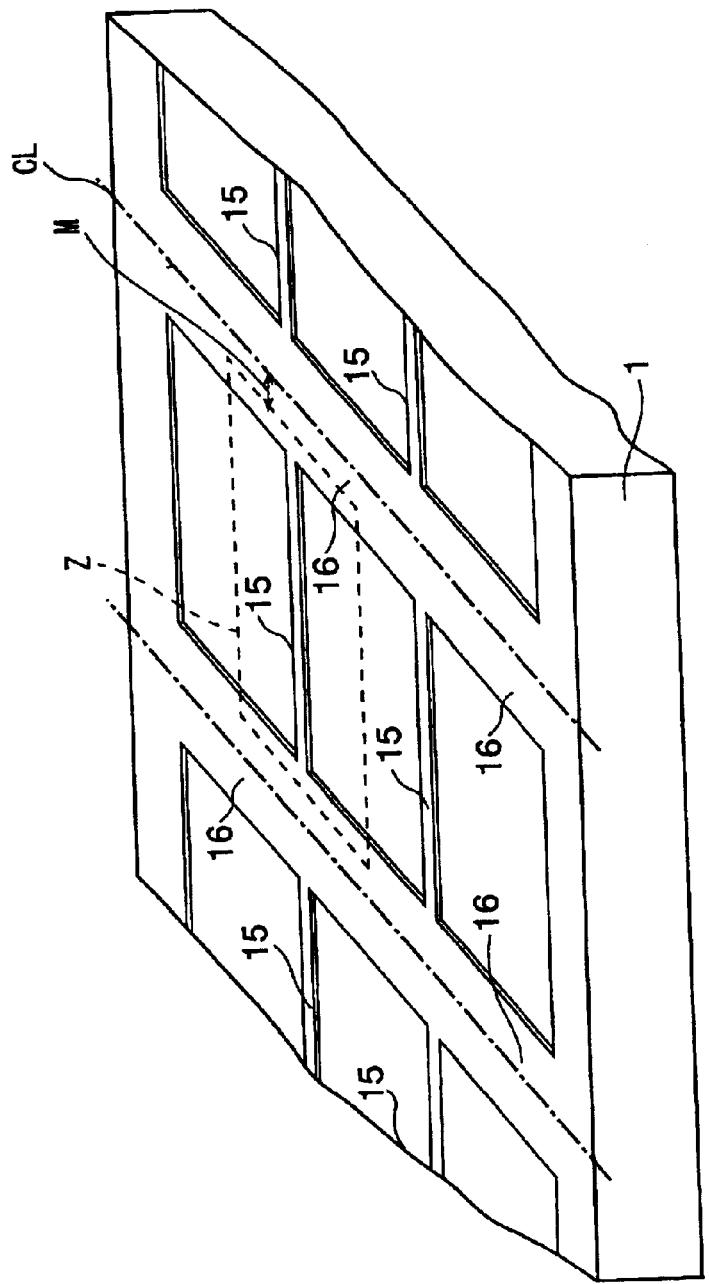
FIG. 14 is a perspective view of a substrate used for fabricating a semiconductor laser according to Example 3.

FIG. 14 is a perspective view of a substrate used for fabricating a semiconductor laser according to Example 3.

An n-type GaAs substrate 1 tilted by 10° to the [0-1-1] direction from the (100) plane is formed with first ridges 15 extending in the [01-1] direction and being 2.7 μm in height and 20 μm in width and second ridges 16 extending in the [0-1-1] direction and being 2.7 μm in height and 140 μm in width. The cycle of the first ridges 15 is 300 μm, and that of the second ridges 16 is 800 μm. These ridges can be formed by photolithography and etching using an etchant of $H_2SO_4:H_2O_2:H_2O$.

In addition, in FIG. 14, the region ultimately forming a semiconductor laser element is indicated by "Z".

The above substrate 1 formed with the first and second ridges 15, 16, in the same way as in Example 1, is formed by MOCVD with a semiconductor stack at a substrate temperature of 690° C.

Next, using the etching stopper layer 8, a ridge stripe of a width of 3 μm is formed in the [01-1] direction at the center of the first ridge 15 by photolithography and wet etching. Further, by MOCVD, an n-type GaAs buried layer 12 is formed over the entire surface.

Next, an electrode 14 is formed on the p-type cap layer 10 and the n-type buried layer 12 to be connected to the p-type cap layer 10 in the portion not including the resonator end surfaces 13 (ranges within 15 μm from the resonator end surfaces 13). The electrode 14 is 670 μm long. The ranges within 15 μm from the resonator end surfaces 13 are made regions without current injection.

Next, the substrate is cleaved at a position 50 μm away from center line CL of the second ridges 16 in the (0-1-1) direction (corresponding to the distance M in FIG. 14) to shorten the light guide. The resultant widths of the second ridges 16 are 20 μm. Further, elements are separated at the (0-1-1) plane at the center of the first ridge in the [01-1] direction. In this way, the semiconductor laser as shown in FIG. 13 is fabricated.

In the semiconductor laser having the above configuration, when the active layer 5 having a multi-quantum well structure is grown on the substrate 1 formed with the first ridge 15 and the second ridges 16, the In concentration on the ridges becomes high. The In concentration becomes higher the narrower a ridge and lower the wider the ridge.

Consequently, the In concentration can be formed high in the active layer 5 of the index guide laser formed in the first ridge 15 of a width of 20 μm and in the [01-1] direction, and the bandgap can be formed narrow. The In concentration can be formed relatively low in the active layer 5 formed in the second ridges 16 of a width of 140 μm and in the [0-1-1] direction, and the bandgap can be formed wide. The difference of the widths of the first ridge 15 and the second ridges 16 is even greater than Example 2, so the difference of In concentrations in the active layer 5 formed on the first ridge 15 and the second ridges 16 can be made even larger.

On the other hand, when the width of the second ridges 16 is made larger, as shown above, if cleavage is performed at the center of the second ridges 16, for second ridges 16 of a width of 140 μm, the width of the window region of a widened bandgap also becomes as wide as 70 μm. But as shown above, by cleavage at a position away from the center line of the second ridges 16 to shorten the light guide, the width of the window region can be made as short as 20 μm or so.

The above structure can be formed by one crystal growth process. Further, because the substrate is tilted, abnormal growth around the first ridge 15 and the second ridges 16 does not arise, and there is almost no change between the growth rate on the first ridge 15 and that on the second ridges 16 at the resonator end surfaces 13. Therefore, there is no step difference of the light guide between the region near the groove and the ends of the resonator, and the problems of the shift of the wave surface, asymmetry of the far field pattern, and so on do not arise.

EXAMPLE 4

Figure 15A:
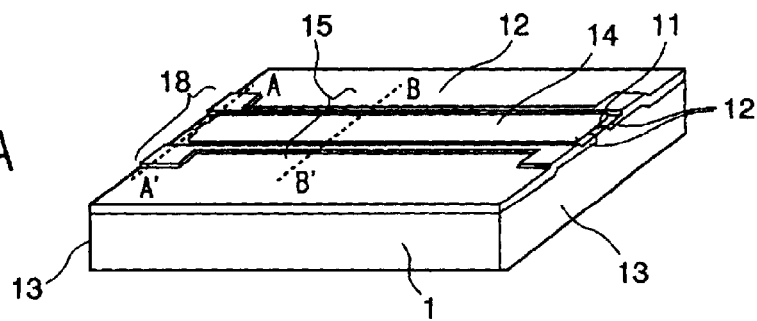
FIGS. 15A to 15C are a perspective view of the configuration of a semiconductor laser according to Example 4, a sectional view of an end surface of a resonator, and a sectional view of the center of the resonator, respectively.
Figure 15B:
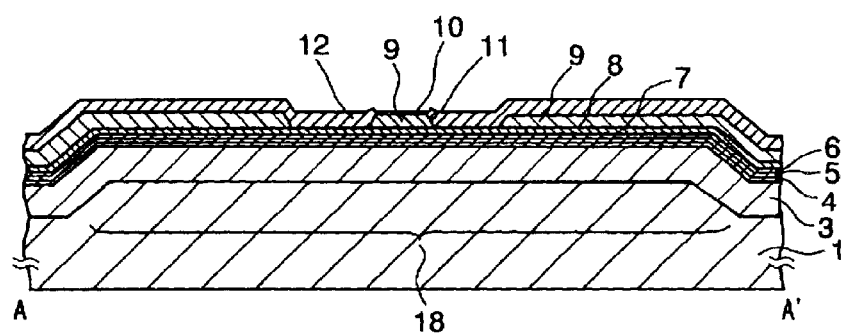
Figure 15C:
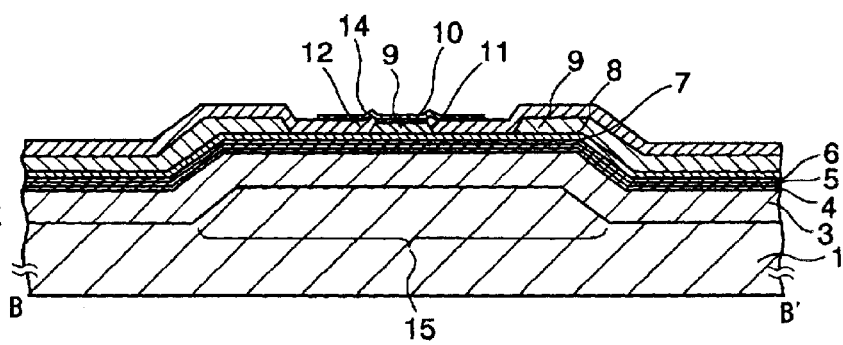

FIGS. 15A to 15C are a perspective view of the configuration of a semiconductor laser according to Example 4, a sectional view along the A–A' line in FIG. 15A, and a sectional view along the B–B' line in FIG. 15A, respectively.

A ridge 15 is formed extending in the direction [01-1] of an n-type GaAs substrate 1 tilted by 10° to the [0-1-1] direction from the (100) plane and is 2.7 μm in height and 20 μm in width. In the regions within 35 μm from the two ends of the ridge 15, ridges 18 are formed of wider width of 70 μm.

The above substrate 1 is deposited with a semiconductor stack in the same way as in Example 1.

The above semiconductor stack is formed with a ridge stripe 11 of a width of 3 μm along the [01-1] direction at the depth to which the etching stopper layer 8 reaches at the center of the ridge 15. An n-type GaAs buried layer 12 is formed over the entire surface resulting in an index guide structure. In addition, an electrode 14 is formed on the, p-type cap layer 10 and the n-type buried layer 12 to be connected to the p-type cap layer 10.

The above semiconductor stack is cleaved at the (01-1) plane perpendicular to the length direction of the ridge stripe 11, and the end surfaces of the above active layer 5 in the region of the ridge stripe 11 become end surfaces of a resonator, whereby a light guide is formed between the end surfaces of the resonator. The length of the resonator is 700 μm.

Further, the electrode 14 is 650 μm long and is not formed in the vicinity of the resonator end surfaces 13 (ranges within 25 μm from the resonator end surfaces 13), so there is no current injection there.

Next, an explanation will be made of a method for fabricating a semiconductor laser of the above example.

FIG. 16 is a perspective view of a substrate used for fabricating a semiconductor laser according to the present example.

An n-type GaAs substrate 1 tilted by 10° to the [0-1-1] direction from the (100) plane is formed with ridges 15 extending in the [01-1] direction and being 2.7 μm in height and 20 μm in width. Here, using the length of the resonator as the cycle, wide ridges 18 each of which is 70 μm long and is widened to 70 μm are formed at the ridges 15. These ridges can be formed by photolithography and etching using an etchant of $H_2SO_4:H_2O_2:H_2O$.

In addition, in FIG. 16, a region ultimately forming a semiconductor laser element is indicated by "Z".

The above substrate 1 formed with the ridges 15 and 18 is formed, in the same way as Example 1, by MOCVD with a semiconductor stack at a substrate temperature of 690° C.

Next, using the etching stopper layer 8, a ridge stripe of a width of 3 μm is formed in the [01-1] direction at the center of the ridge 15 by photolithography and wet etching. Further, by MOCVD, an n-type GaAs buried layer 12 is formed over the entire surface.

Next, an electrode 14 is formed on the p-type cap layer 10 and the n-type buried layer 12 to be connected to the p-type cap layer 10 in the portion not including the resonator end surfaces 13 (ranges within 25 μm from the resonator end surfaces 13). The electrode 14 is 650 μm long. The ranges within 25 μm from the resonator end surfaces 13 are made regions without current injection.

Next, the substrate is cleaved at the (01-1) plane at the center of the ridges 18. The elements are separated at the (0-1-1) plane among the first ridges 15 in the [01-1] direction. In this way, the semiconductor laser as shown in FIGS. 15A to 15C is fabricated.

In the semiconductor laser having the above configuration, when the active layer 5 having a multi-quantum well structure is grown on the substrate 1 formed with the ridge 15 and the wide ridges 16, the In concentration becomes higher the narrower the ridge and lower the wider the ridge.

Consequently, the In concentration can be formed high in the active layer 5 of the index guide laser formed on the ridge 15 of a width of 20 μm and in the [01-1] direction, and the bandgap can be formed narrow. The In concentration can be formed relatively low in the active layer 5 formed in the wide ridges 18 of a width of 70 μm, and the bandgap can be formed wide.

In the above way, a semiconductor laser is formed having a window structure in which the bandgap is wide in regions within 35 μm from the resonator end surfaces and having no current injection in the window structure.

In addition, the above structure can be formed by one crystal growth process. Further, because the substrate is tilted, abnormal growth around the ridge 15 and the wide ridge 18 does not arise, and there is almost no change between the growth rate on the ridge 15 and that on the wide ridges 18 at the resonator end surfaces 13. Therefore, there is no step difference of the light guide between the region near the groove and the ends of the resonator, and the problems of the shift of the wave surface, asymmetry of the far field pattern, and so on do not arise.

Note that, in the above examples, the same effects can be obtained even if the heights of ridges or wide ridges and the depths of grooves are greater than 0.4 μm. The heights of ridges or wide ridges and the depths of grooves may be even larger. For example, the same effects can be obtained when they are 4 μm.

Further, in the above examples, the descriptions were made of cases in which the present invention was applied to a GaAs buried index guide laser, but the configuration of the laser to which the present invention is applicable is not limited to this.

In addition, the method for forming a groove or a ridge structure is not limited to wet etching. Any methods that can form a groove or a ridge structure may be used. For example, reactive ion etching (RIE) may also be used.

In addition, concerning the etchant for wet etching, any etchant that can form a groove or the ridge structure may be used.

Figure 17A:
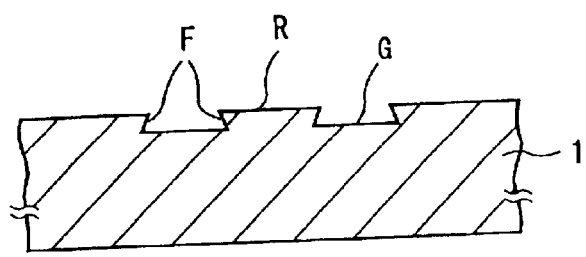
FIGS. 17A and 17B are sectional views of other examples of substrates used for producing semiconductor lasers according to Examples 1 to 4.
Figure 17B:
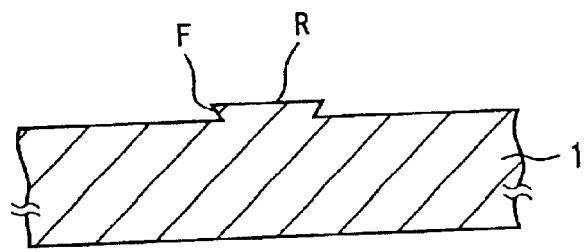

In addition, the inclination angles of the groove side surfaces or ridge side surfaces resulting from processes of forming the grooves or the ridge structures are not limited by the above examples. For example, as shown in FIG. 17A, a groove may have a bottom larger than its opening and having inclined side surfaces F having inclination angles larger than 90°. The same is true for the ridge structure. As shown in FIG. 17B, a ridge may even be comprised of inclined side surfaces F having inclination angles larger than 90°.

In addition, in the above examples, the active layer was made a multi-quantum well layer, but it may also be a bulk active layer. The multi-quantum well layer may also be a strained super lattice layer. The distortion may be compression strain, tensile strain, or strain of a strain-compensated strained super lattice layer.

Further, in the above examples, the growth temperature of the semiconductor stack was set to 690° C. But an even higher or lower temperature may also be used. For example, the same effect can be obtained with a temperature in the range from 640° C. to 730° C.

Modifications

In the above embodiments and examples, when arranging the light guide P on a ridge, the light guide P need not always be positioned at the center of the ridge R.

In particular, for example, as shown in FIG. 18A, a ridge 15 is formed on a substrate 1 tilted to the [0-1-1] direction from the (100) plane and a semiconductor stack comprising an n-type cladding layer 3, an active layer 5, a p-type cladding layer 7 (9), a p-type cap layer 10, and so on is deposited on this. As a result, in addition to a ridge region Ra whose surface orientation retains the above inclined surface, sometimes a ridge region Rb having a surface close to the (100) plane appears. At this time, in order to avoid using the ridge region Rb, as shown in FIG. 18B, it is preferable to arrange the ridge stripe 11 becoming the light guide P close to one step difference of the ridge 15 in the ridge region Ra whose surface orientation retains the inclined surface.

EXAMPLE 5

A semiconductor laser was fabricated on a substrate formed with a low surface region and formed with a step difference at its edge according to the third embodiment shown in FIG. 5A. The photo luminescence spectrum corresponding to the bandgaps in the different regions was then measured.

Figure 19:
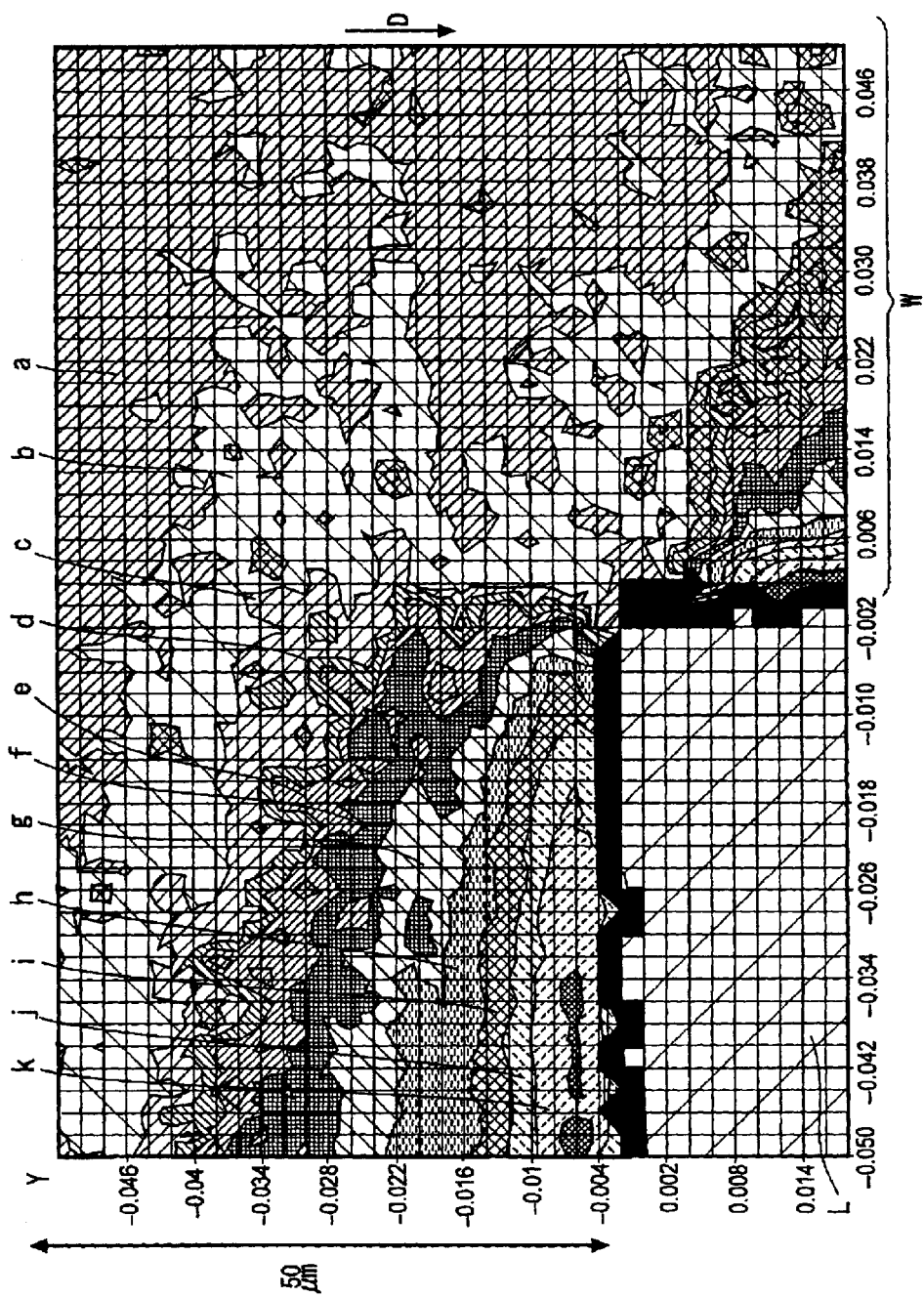
FIG. 19 is a view of a photoluminescence spectrum according to Example 5.

The results are shown in FIG. 19. In this figure, the ordinate and the abscissa represent lengths in unit of mm. The direction of the arrow D indicates the [0-1-1] direction. The lower left region L corresponds to the low surface region, and the region at the right side becomes the window region W.

The light emission wavelengths in different regions are represented by the different types and concentrations of hatching, that is, region a for 650.5 to 651.0 nm, region b for 651.0 to 651.5 nm, region c for 651.5 to 652.0 nm, region d for 652.0 to 652.5 nm, region e for 652.5 to 653.0 nm, region f for 653.0 to 653.5 nm, region g for 653.5 to 654.0 nm, region h for 654.0 to 654.5 nm, region i for 654.5 to 655.0 nm, region j for 655.0 to 655.5 nm, and region k for 655.5 to 656.0 nm.

From FIG. 19, the light emission wavelength becomes longer the closer to the step difference of the edge of the low surface region L and becomes shorter the further from it.

Although the wavelength is shortest in the window region W, the change of the light emitting wavelength of the window region W is merely 1 nm or less in the region within 50 μm from the step difference of the edge portion of the low surface region L. This reveals that the light guide P should be arranged in the region within 50 μm from the step difference of the edge portion of the low surface region L.

EXAMPLE 6

A semiconductor laser was fabricated on a substrate formed with two grooves and formed with a ridge between them according to the second embodiment shown in FIG. 4B. The photo luminescence spectrum corresponding to the bandgaps in the different regions was measured.

Figure 20:
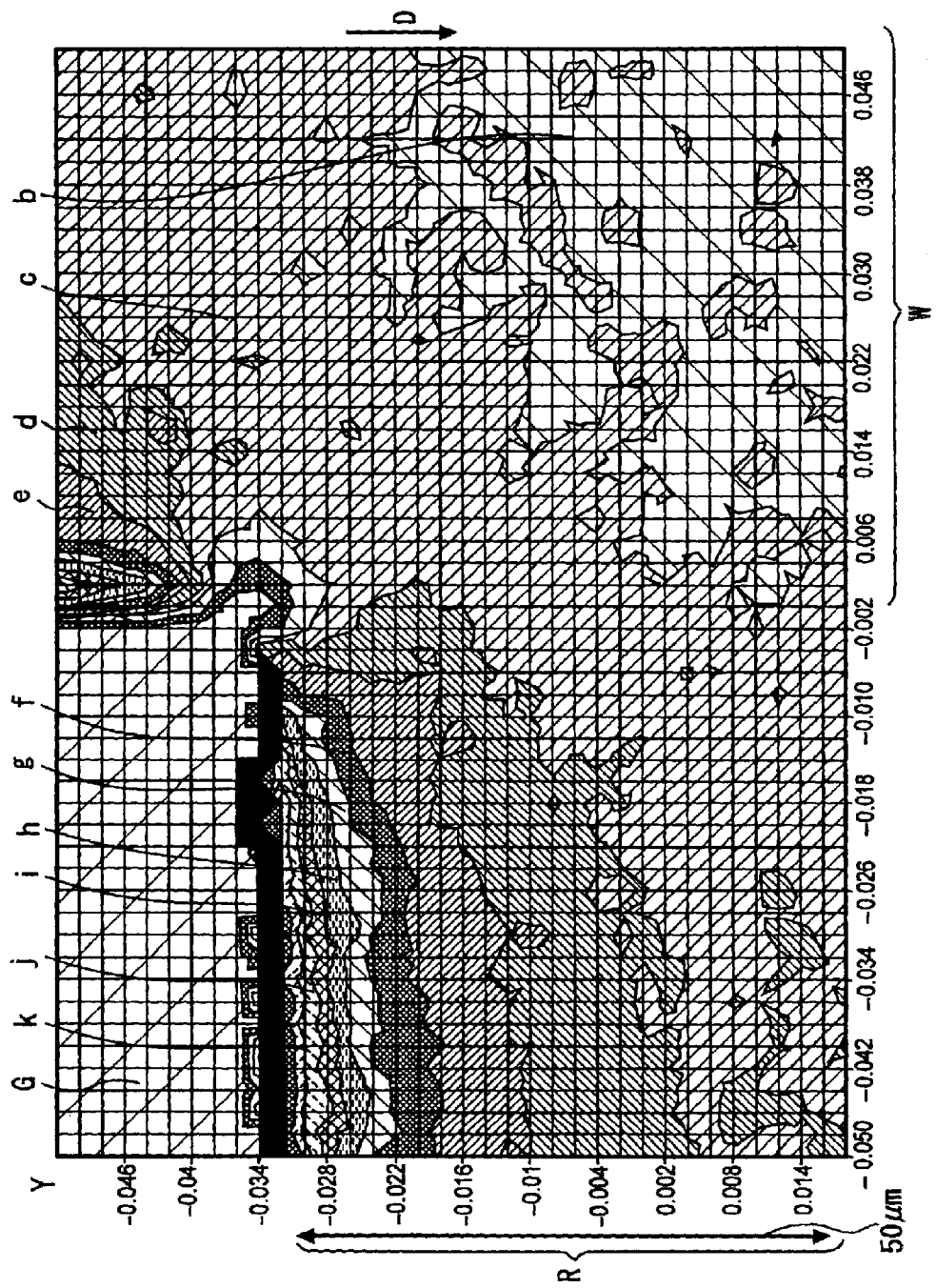
FIG. 20 is a view of a photoluminescence spectrum according to Example 6.

The result is shown in FIG. 20. In this figure, the ordinate and the abscissa represent lengths in unit of mm. The direction of the arrow D indicates the [0-1-1] direction. The upper left region G corresponds to one of the groove regions, the region below G corresponds to the ridge R, and the region right to G is the window region W.

The light emission wavelengths in the different regions are represented by the different types and concentrations of hatching, that is, region b for 651.0 to 651.5 nm, region c for 651.5 to 652.0 nm, region d for 652.0 to 652.5 nm, region e for 652.5 to 653.0 nm, region f for 653.0 to 653.5 nm, region g for 653.5 to 654.0 nm, region h for 654.0 to 654.5 nm, region i for 654.5 to 655.0 nm, region j for 655.0 to 655.5 nm, and region k for 655.5 to 656.0 nm.

From FIG. 20, the light emission wavelength becomes longer the closer to the step differences of the ridge R and becomes shorter the further from them.

Although the wavelength is shortest in the window region W, in the same way as the above Example 5, the change of the light emission wavelength of the window region W is merely 1 nm or less in the region within 50 μm from a step difference of the grooves. This reveals that the light guide P should be arranged in the region within 50 μm from a step difference of the grooves.

EXAMPLE 7

A semiconductor laser was fabricated on a substrate formed with two grooves and formed with a ridge of a width of 20 μm between them according to the second embodiment shown in FIG. 4B. The photo luminescence spectrum corresponding to the bandgaps in the different regions was measured.

Figure 21:
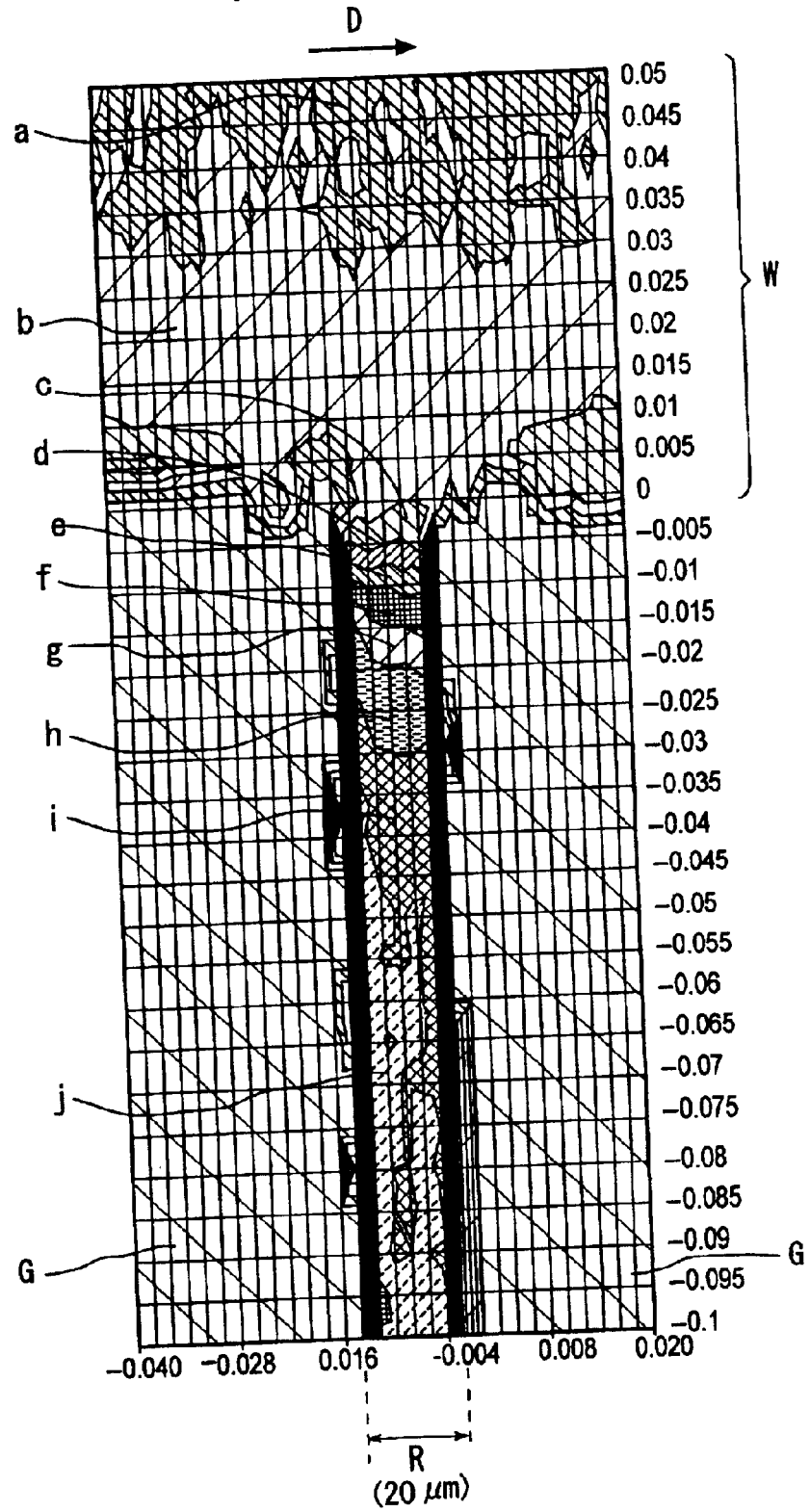
FIG. 21 is a view of a photoluminescence spectrum according to Example 7.

The result is shown in FIG. 21. In this figure, the ordinate and the abscissa represent lengths in unit of mm. The direction of the arrow D indicates the [0-1-1] direction. The upper left and upper right regions G correspond to the two groove regions, the region between the regions G corresponds to the ridge R, and the regions above G and R are the window regions W.

The light emission wavelengths in the different regions are represented by the different types and concentrations of hatching, that is, region a for 651.0 to 652.0 nm, region b for 652.0 to 653.0 nm, region c for 653.0 to 654.0 nm, region d for 654.0 to 655.0 nm, region e for 655.0 to 656.0 nm, region f for 656.0 to 657.0 nm, region g for 657.0 to 658.0 nm, region h for 658.0 to 659.0 nm, region i for 659.0 to 660.0 nm, and region j for 660.0 to 661.0 nm.

From FIG. 21, it is confirmed that the light emission wavelength becomes longer on the ridge R and becomes shorter the further from the window regions W, so a window structure is formed.

EXAMPLE 8

The same semiconductor laser as that of Example 7 was fabricated with a ridge width of 20 μm. The photo luminescence spectrum corresponding to the bandgaps in the different regions was measured.

Figure 22:
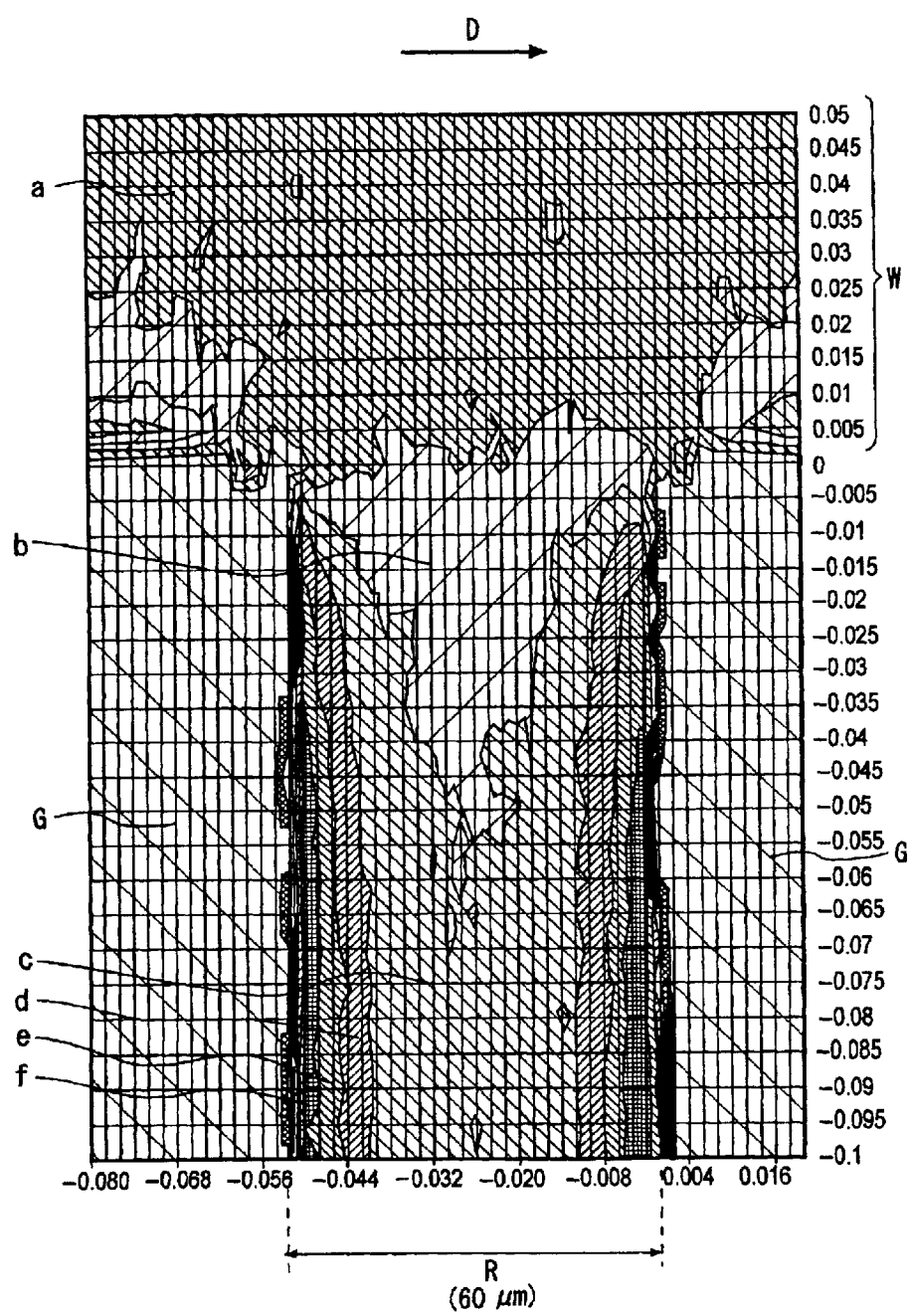
FIG. 22 is a view of a photoluminescence spectrum according to Example 8.

The result is shown in FIG. 22. In this figure, the ordinate and the abscissa represent lengths in unit of mm. The direction of the arrow D indicates the [0-1-1] direction. The upper left and upper right regions G correspond to the two groove regions, the region between the regions G corresponds to the ridge R, and the regions above G and R are the window regions W.

The light emission wavelengths in different regions are represented by the different types and concentrations of hatching, that is, region a for 651.0 to 652.0 nm, region b for 652.0 to 653.0 nm, region c for 653.0 to 654.0 nm, region d for 654.0 to 655.0 nm, region e for 655.0 to 656.0 nm, and region f for 656.0 to 657.0 nm.

From FIG. 22, examining the center portion of the ridge R, it is confirmed that the difference of the light emission wavelength in the ridge R and in the window regions W is relatively high, that is, 2 nm or so, so although a window structure is formed, it is not effective.

EXAMPLE 9

The same semiconductor laser as that in the Example 7 was fabricated with a ridge width pf 100 μm. The photo luminescence spectrum corresponding to the bandgaps in the different regions was measured.

Figure 23:
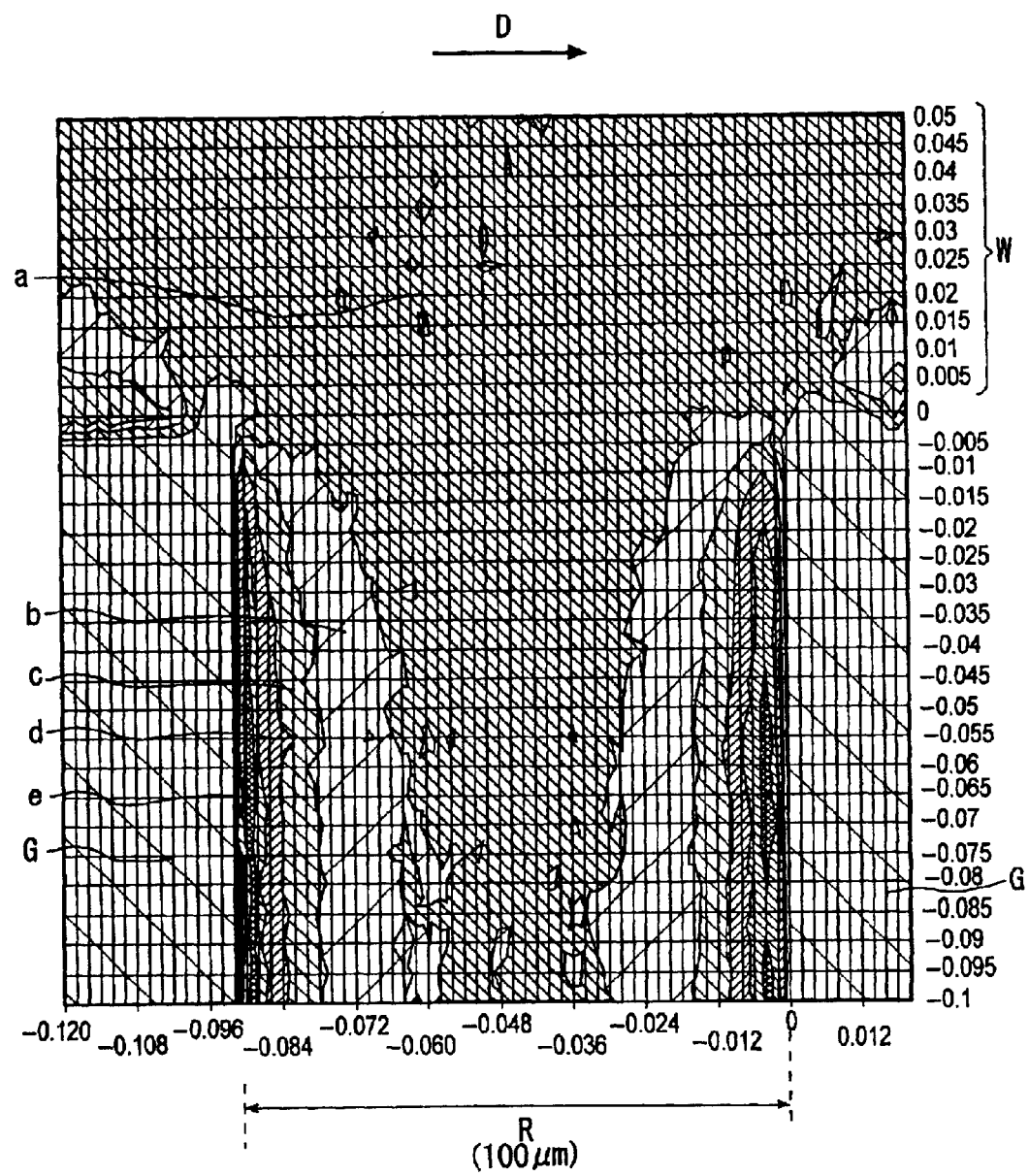
FIG. 23 is a view of a photoluminescence spectrum according to Example 9.

The result is shown in FIG. 23. In this figure, the ordinate and the abscissa represent lengths in unit of mm. The direction of the arrow D indicates the [0-1-1] direction. The upper left and upper right regions G correspond to the two groove regions, the region between the regions G corresponds to the ridge R, and the regions above G and R are the window regions W.

The light emission wavelengths in different regions are represented by the different types and concentrations of hatching, that is, region a for 651.0 to 652.0 nm, region b for 652.0 to 653.0 nm, region c for 653.0 to 654.0 nm, region d for 654.0 to 655.0 nm, and region e for 655.0 to 656.0 nm.

From FIG. 23, examining the center portion of the ridge R, it is confirmed that there is no difference between the light emission wavelength in the ridge R and in the window regions W, so a window structure is not formed.

Summarizing the effects of the present invention, according to the semiconductor laser according to the present invention, the In concentration is raised only in the vicinity of the resonator end surfaces, and a window structure is formed with a wider bandgap in the vicinity of the resonator end surfaces.

The above structure can be formed by one growth process. Further, there is little difference of the growth rates between the vicinity of the ends of the resonator and other regions of the resonator. Therefore, it is possible to easily realize a window structure type semiconductor laser without a step difference of the light guide in the vicinity of the ends of the resonator and free from the problems of the shift of the wave surface, asymmetry of the far field pattern, and so on.

According to the method for producing the semiconductor laser according to the present invention, by one growth process, the In concentration is raised only in the vicinity of the resonator end surfaces and a window structure is able to be formed with a wider bandgap in the vicinity of the resonator end surfaces. Further, there is little difference of the growth rates between the vicinity of the ends of the resonator and any other regions of the resonator. Therefore, it is possible to easily fabricate a window structure type semiconductor laser without a step difference of the light guide in the vicinity of the ends of the resonator and free from the problems of the shift of the wave surface, asymmetry of the far field pattern, and so on.

While the invention has been described with reference to specific embodiments chosen for purpose of illustration, it should be apparent that numerous modifications could be made thereto by those skilled in the art without departing from the basic concept and scope of the invention.

What is claimed is:

1. A semiconductor laser having a light guide between resonator end surfaces formed by end surfaces of an active layer, comprising
    a substrate having a surface tilted to a [0-1-1] direction from a (100) plane and
    a semiconductor stack formed on said substrate and comprising the active layer having two types of Group III elements including at least indium (In) and Group V elements including phosphorus (P) and a cladding layer of a first conductivity and a cladding layer of a second conductivity provided above and below said active layer, respectively, wherein
    at least one step-like structure is provided on said substrate and said light guide is provided at an upper step side of said step-like structure so that a portion of said light guide not including said resonator end surfaces is positioned in a vicinity of said step-like structure and so that a distance between said resonator end surface portions of said light guide and said step-like structure become greater than a distance between said portion of said light guide not including said resonator end surfaces and said step-like structure.

2. A semiconductor laser as set forth in claim 1, wherein said step-like structure is formed only in a vicinity of said portion of said light guide not including said resonator end surfaces.

3. A semiconductor laser as set forth in claim 1, wherein
    said step-like structure comprises a step difference of a groove provided in said substrate, and
    said light guide is arranged at an upper step side of said step difference of said groove so that said portion of said light guide not including said resonator end surfaces is positioned in a vicinity of said step difference of said groove and so that a distance between said resonator end surface portions of said light guide and said step difference of said groove become greater than a distance between said portion of said light guide not including said resonator end surfaces and said step difference of said groove.

4. A semiconductor laser as set forth in claim 3, wherein said groove is formed only in a vicinity of said portion of said light guide not including said resonator end surfaces.

5. A semiconductor laser as set forth in claim 3, wherein said distance between said resonator end surface portions of said light guide and said step difference of said groove are not more than 50 μm.

6. A semiconductor laser as set forth in claim 1, wherein
   said step-like structure comprises a ridge provided projecting out on said substrate and having a width at least that of said light guide and
   said light guide is arranged on said ridge so that said portion of said light guide not including said resonator end surfaces is positioned in a vicinity of a step difference of said ridge and so that distance between said resonator end surface portions of said light guide and said step difference of said ridge become greater than a distance between said portion of said light guide not including said resonator end surfaces and said step difference of said ridge.

7. A semiconductor laser as set forth in claim 6, wherein
   said substrate is provided with a first ridge having a width at least that of said light guide and extending along a direction in which said light guide extends and second ridges intersecting said first ridge, and
   said light guide is arranged on said first ridge so that said resonator end surfaces of said light guide are positioned in regions where said first ridge and said second ridges intersect.

8. A semiconductor laser as set forth in claim 6, wherein in said regions where said resonator end surfaces of said light guide are positioned said ridge is formed wider than said region where said portion of said light guide not including said resonator end surfaces is positioned.

9. A semiconductor laser as set forth in claim 6, wherein a width of said ridge is not more than 100 μm.

10. A semiconductor laser as set forth in claim 1, wherein a direction of said resonator is a [01-1] direction of said substrate.

11. A semiconductor laser as set forth in claim 1, wherein an inclination angle to said [0-1-1] direction of said (100) plane of said substrate is 2° to 15°.

12. A semiconductor laser as set forth in claim 1, wherein said substrate comprises GaAs, GaP, or InP.

13. A method for producing a semiconductor laser having a light guide between resonator end surfaces formed by end surfaces of an active layer, comprising the steps of
   providing at least one step-like structure on a substrate having a surface tilted to a [0-1-1] direction from a (100) plane and
   forming on said substrate a semiconductor stack having an active layer including two types of Group III elements including at least indium (In) and Group V elements including phosphorus (P) and a cladding layer of a first conductivity and a cladding layer of a second conductivity arranged above and below said active layer, respectively, wherein
   said light guide is provided at an upper step side of said step-like structure so that a portion of said light guide not including said resonator end surfaces is positioned in a vicinity of said step-like structure and so that a distance between said resonator end surface portions of said light guide and said step-like structure is greater than a distance between said portion of said light guide not including said resonator end surfaces and said step-like structure.

14. A method for producing a semiconductor laser as set forth in claim 13, wherein
   a groove is provided on said substrate as said step-like structure and said light guide is arranged at an upper step side of said groove so that said portion of said light guide not including said resonator end surfaces is positioned in a vicinity of said groove and so that a distance between said resonator end surface portions of said light guide and said groove are greater than a distance between said portion of said light guide not including said resonator end surfaces and said groove.

15. A method for producing a semiconductor laser as set forth in claim 13, wherein
   the step of providing said step-like structure includes a step of providing a ridge that has a width at least that of said light guide projecting from said substrate and
   a step of arranging said light guide on said ridge so that said portion of said light guide not including said resonator end surfaces is positioned in a vicinity of a step difference of said ridge and so that a distance between said resonator end surface portions of said light guide and said step difference of said ridge are greater than a distance between said portion of said light guide not including said resonator end surfaces and said step difference of said ridge.

16. A method for producing a semiconductor laser as set forth in claim 15, wherein
   the step of providing said step-like structure includes a step of providing on said substrate a first ridge having a width at least that of said light guide and extending in a direction in which said light guide extends and second ridges having a width at least a width of said first ridge and intersecting said first ridge and,
   the step of forming said semiconductor stack includes a step of forming it on said substrate where said first said second ridges are formed by metal organic chemical vapor deposition (MOCVD) and
   further comprising a step of cleaving said substrate where said semiconductor stack is formed on said second ridges.

17. A method for producing a semiconductor laser as set forth in claim 16, wherein
   said first ridge is formed which extends in a [01-1] direction of said substrate and
   said second ridges are formed which extend in a [0-1-1] direction of said substrate.

18. A method for producing a semiconductor laser as set forth in claim 16, wherein the step of cleaving said substrate on which said semiconductor stack is formed includes a step of cleaving said second ridges at a position at said light guide side from a center line equally dividing said second ridges in an extending direction of said second ridges.

* * * * *